(12) United States Patent
Fujiwara et al.

(10) Patent No.: US 11,910,587 B2
(45) Date of Patent: Feb. 20, 2024

(54) MEMORY CIRCUIT HAVING SRAM MEMORY CELLS AND METHOD FOR FORMING A SRAM MEMORY CELL STRUCTURE

(71) Applicant: Taiwan Semiconductor Manufacturing Company, Ltd., Hsinchu (TW)

(72) Inventors: Hidehiro Fujiwara, Hsinchu (TW); Yi-Hsin Nien, Hsinchu (TW); Hung-Jen Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 150 days.

(21) Appl. No.: 17/410,860

(22) Filed: Aug. 24, 2021

(65) Prior Publication Data

US 2022/0278111 A1 Sep. 1, 2022

Related U.S. Application Data

(60) Provisional application No. 63/154,513, filed on Feb. 26, 2021.

(51) Int. Cl.
*H10B 10/00* (2023.01)
(52) U.S. Cl.
CPC ............. *H10B 10/18* (2023.02); *H10B 10/12* (2023.02)
(58) Field of Classification Search
CPC ...... H10B 10/18; H10B 10/12; G11C 11/412; G11C 15/04; G11C 11/419; H01L 27/0207; H01L 21/823821; H01L 21/823871; Y10S 257/903
USPC ......................................................... 257/369
See application file for complete search history.

(56) References Cited

U.S. PATENT DOCUMENTS

| 9,659,599 | B1 * | 5/2017 | Liaw | H01L 25/0657 |
| 2004/0062089 | A1 * | 4/2004 | Sumita | G11C 8/16 |
| | | | | 365/200 |
| 2004/0120209 | A1 * | 6/2004 | Lee | G11C 8/16 |
| | | | | 365/185.05 |
| 2015/0248927 | A1 * | 9/2015 | Fujiwara | G11C 5/06 |
| | | | | 365/72 |
| 2016/0126178 | A1 * | 5/2016 | Fujiwara | H10B 10/12 |
| | | | | 257/774 |
| 2016/0240539 | A1 * | 8/2016 | Mojumder | G11C 11/419 |
| 2017/0221552 | A1 * | 8/2017 | Liaw | H01L 28/00 |

* cited by examiner

*Primary Examiner* — Duy T Nguyen
(74) *Attorney, Agent, or Firm* — Finnegan, Henderson, Farabow, Garrett & Dunner, L.L.P

(57) ABSTRACT

An apparatus includes memory cells. A first memory cell of the memory cells includes a first write port laid out in a first doping region and a first read port laid out in a second doping region. The first read port is separated from the first write port by a second write port of a second memory cell of the memory cells.

20 Claims, 25 Drawing Sheets

MEMORY CIRCUIT HAVING SRAM MEMORY CELLS AND METHOD FOR FORMING A SRAM MEMORY CELL STRUCTURE

REFERENCE TO RELATED APPLICATION

This application claims the benefit of U.S. Provisional Application No. 63/154,513, filed on Feb. 26, 2021, the entirety of which is incorporated by reference herein.

BACKGROUND

Semiconductor memory is an electronic data storage device implemented on a semiconductor-based integrated circuit and has much faster access times than other types of data storage technologies. For example, static random-access memories (SRAM) are commonly used in integrated circuits. Embedded SRAM is popular in high-speed communication, image processing and system-on-chip (SOC) applications. A bit can be read from or written into the SRAM cell within a few nanoseconds, while access times for rotating storage such as hard disks is in the range of milliseconds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
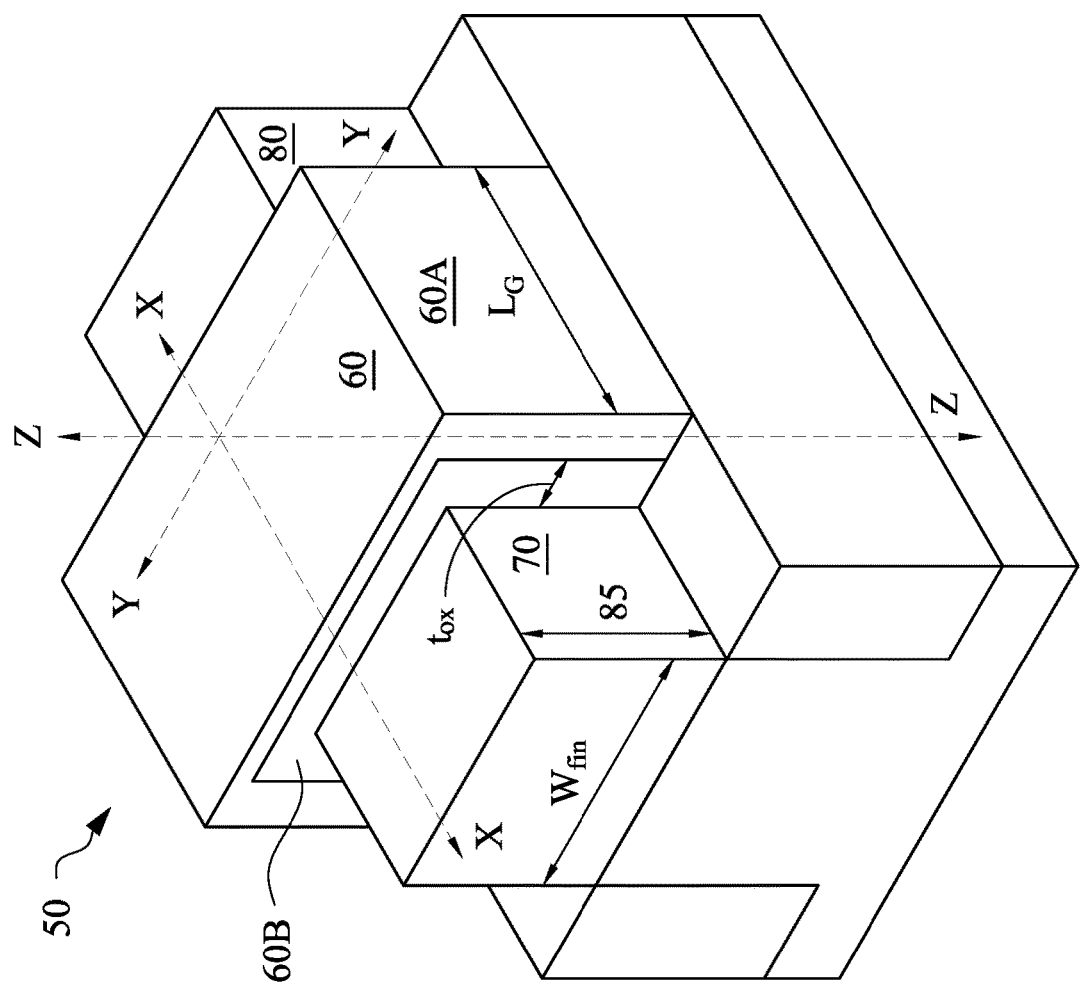
FIG. 1A illustrates a perspective view of an exemplary FinFET device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected." "Coupled" and "connected" may also be used to indicate that two or more elements cooperate or interact with each other.

The present disclosure is related to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1A, a perspective view of an exemplary FinFET device 50 is illustrated, in accordance with some embodiments of the present disclosure. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1A. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness tox measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 1B:
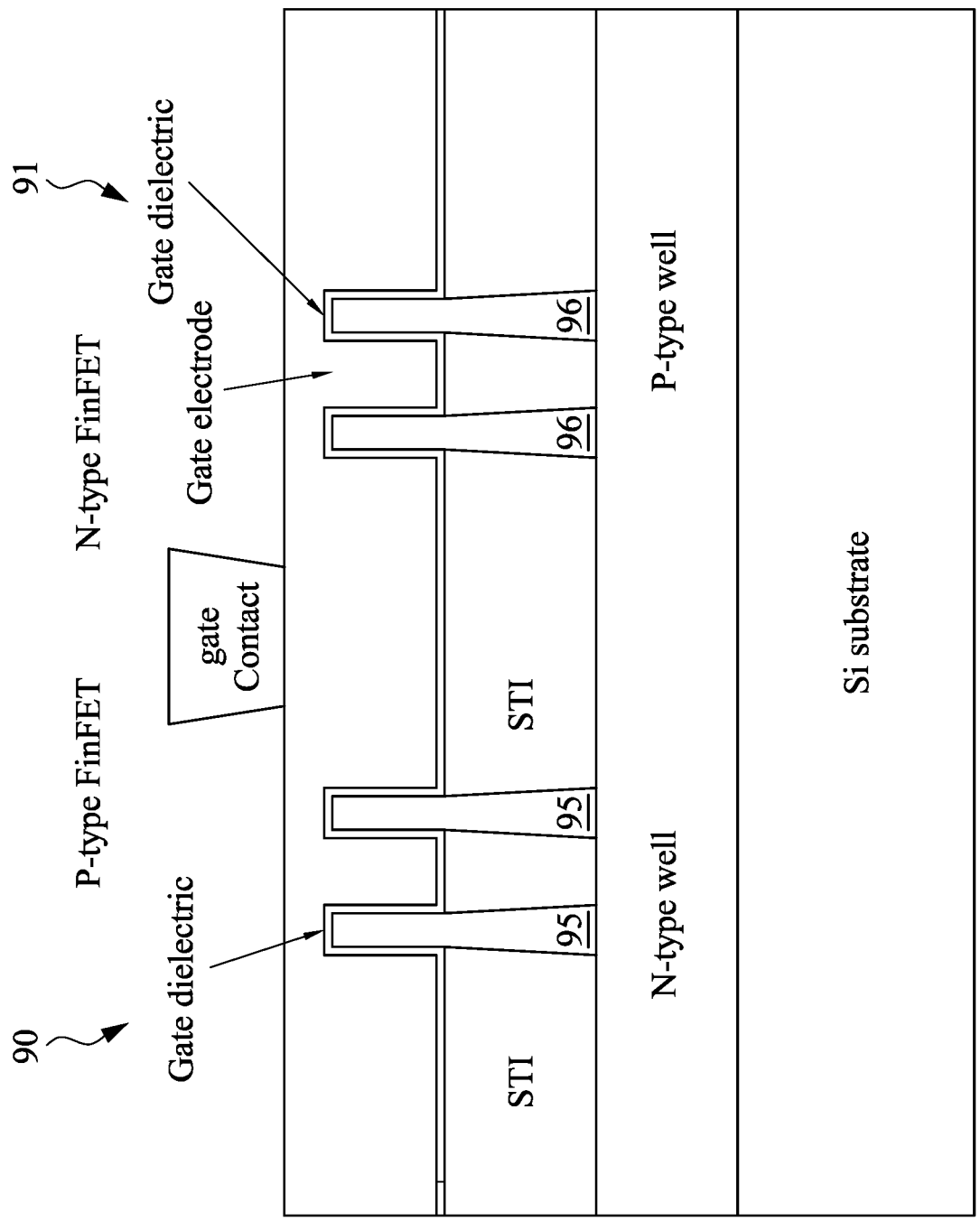
FIG. 1B illustrates a cross-sectional side view of FinFET transistors in a CMOS configuration, in accordance with some embodiments of the present disclosure.

FIG. 1B illustrates a cross-sectional side view of FinFET transistors in a CMOS configuration, in accordance with some embodiments of the present disclosure. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 1C:
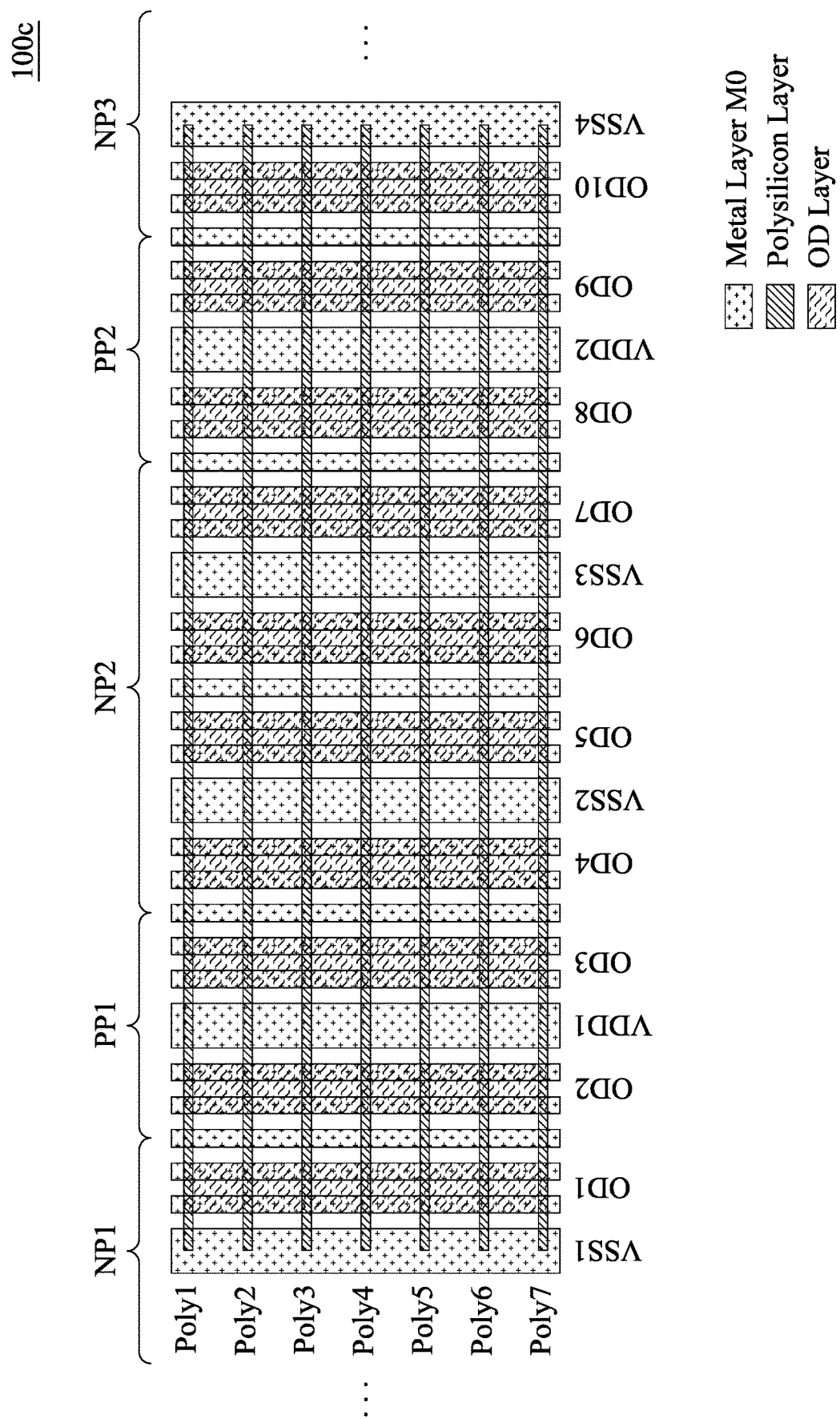
FIG. 1C illustrates a top view of a standard (STD) cells array, in accordance with some embodiments of the present disclosure.

FIG. 1C illustrates a top view of a standard (STD) cells array 100c having multiple FinFET devices (e.g., the P-type FinFET 90 and the N-type FinFET 91) illustrated in FIG. 1B, in accordance with some embodiments of the present disclosure. The standard cells array 100c may include logic circuits or logic devices, and as such it is also referred to as a logic cells array or a logic circuit array. In various embodiments, the logic circuits or devices may include components such as inverters, NAND gates, NOR gates, flip-flops, or combinations thereof.

In at least one example, the term "oxide-definition (OD) region" is an active region for a transistor, i.e., the area where a source, a drain, and a channel under a gate of the transistor are formed. In some examples, the oxide definition region is between insulating regions. In some embodiments, the insulating regions are shallow trench isolation (STI), field oxide (FOX) areas, or other suitable electrically insulating structures. In some embodiments, the insulating regions are called inactive regions or isolation regions. As illustrated in FIG. 1C, the standard cells array 100c includes N-type FinFET transistors in n-plus (NP) regions NP1, NP2, NP3 associated with corresponding P-type wells, as well as P-type FinFET transistors in p-plus (PP) regions PP1, PP2 associated with corresponding N-type wells. The standard cells array 100c also includes elongated fin lines, for example fin lines in oxide-definition (OD) regions OD2, OD3, OD8, OD9 as parts of the P-type FinFET transistors, as well as fin lines in OD regions OD1, OD4-7, OD10 as parts of the N-type FinFET transistors. The P-type FinFET fin lines are located over the N-type wells in PP regions PP1, PP2, whereas the N-type FinFET fin lines are located over the P-type wells in NP regions NP1, NP2, and NP3. As shown in FIG. 1C, to satisfy basic standard cell rules, each PP or NP region includes at least two OD regions. In addition, two OD regions are sandwiched by adjacent power/ground ports (VDD or VSS) VDD1, VDD2, VSS1-VSS4.

As an example, the array 100c shown herein includes cells arranged into rows and columns. FIG. 1C merely illustrates an example of the array 100c, and other embodiments may have different numbers of cells and/or may be arranged differently.

As shown in FIG. 1C, the fin lines in OD regions OD1-OD10 each extend through a respective column of the cells in an X-direction (X-direction of FIG. 1A). Thus, the fin lines may each be considered "continuous." As discussed above with reference to FIG. 1A, the fin lines each include a channel region as well as source/drain regions located next to (e.g., on opposite sides of) the channel region. The FinFET transistors of the STD cells array 100c each include a respective gate electrode formed in a polysilicon region (e.g., polysilicon regions Poly1-Poly7) that wraps around a respective one of the fin lines in the manner described above with reference to FIG. 1A. In some embodiments, the P-type FinFET (PMOSFET) fin lines are comprised of a silicon germanium (SiGe) material (for enhancing the strain effect), but the N-type FinFET (NMOSFET) fin lines are comprised of a non-germanium-containing semiconductor material, for example silicon (Si). Therefore, in some embodiments, the PMOSFET has a SiGe channel, and the NMOSFET has a Si channel. In some embodiments, a channel fin width of the NMOSFET is narrower than a channel fin width of the PMOSFET. In some embodiments, the source/drain regions of the NMOSFET includes an epi-material selected from the group consisting of: SiP, SiC, SiPC, SiAs, Si, or combinations thereof. It is understood that materials or configurations discussed above are merely examples and are not intended to be limiting. Other possible materials or configurations are also within the scope of the present disclosure. In some embodiments, the PMOSFET's source/drain region has a wider width than the channel region. As discussed above, in some embodiments, the fin lines of the cells array 100c can be continuous and extend across two or more cells abutted in the X-direction.

Figure 1D:
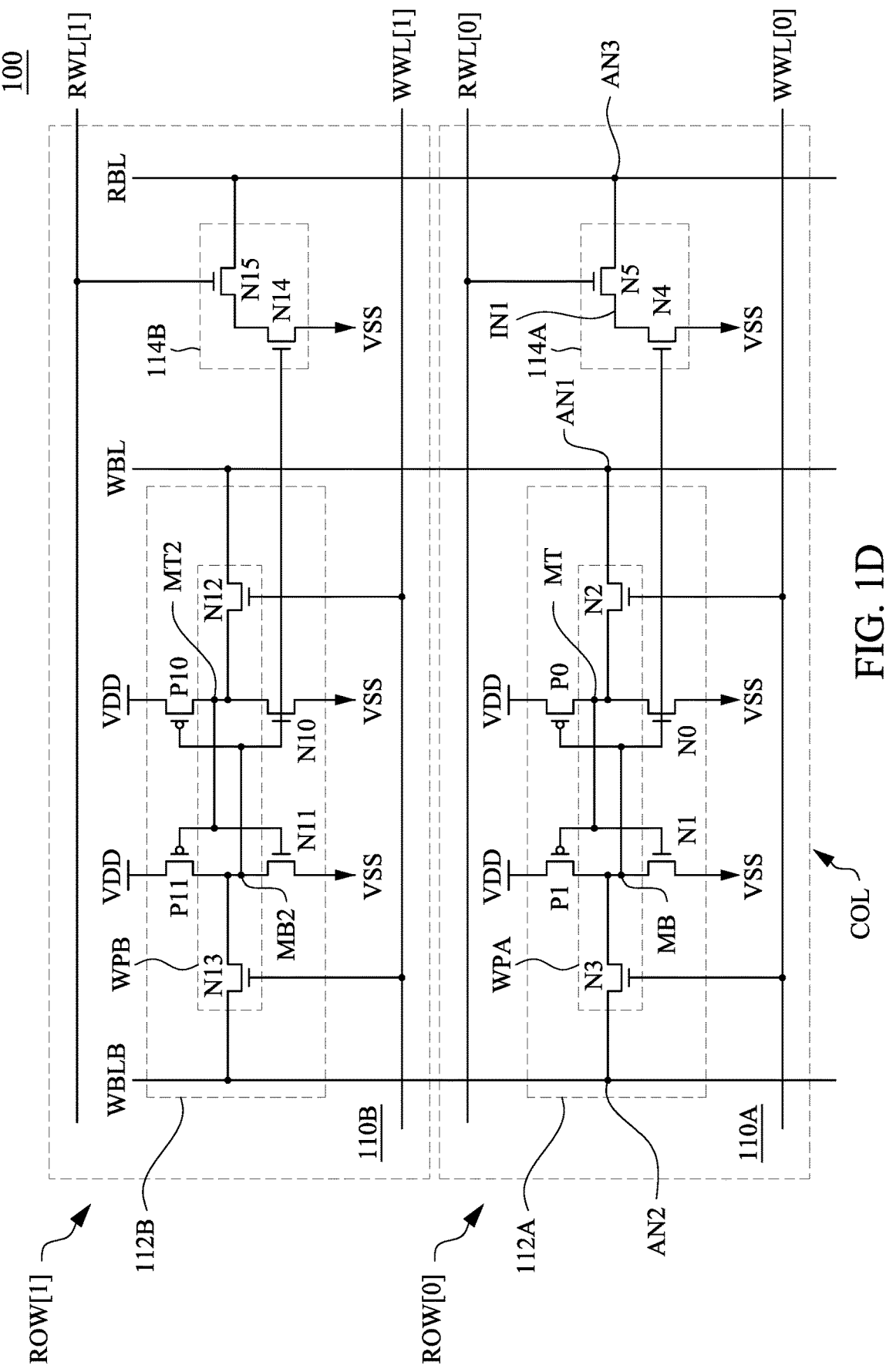
FIG. 1D is a circuit diagram of a portion of a memory circuit in accordance with some embodiments of the present disclosure.

FIG. 1D is a circuit diagram of a portion of a memory circuit 100 in accordance with some embodiments. Memory circuit 100 of FIG. 1D can be implemented by placing and connecting FinFET transistors illustrated in FIG. 1A and/or FIG. 1B in the layout design based on the standard cells array 100c of FIG. 1C. Memory circuit 100 includes a plurality of memory cells arranged into columns and one or more pairs of adjacent rows. A pair of adjacent rows refers to two rows of memory cells without any intermediate row of memory cells therebetween. For example, FIG. 1D depicts that memory circuit 100 includes memory cells 110A, and 110B, which belong to a column COL. Also, memory cell 110A belongs to a first row ROW[0], and memory cell 110B belongs to a second row ROW[1]. In some embodiments, memory circuit 100 includes two or more columns of memory cells. In some embodiments, memory circuit 100 includes two or more rows of memory cells. Other memory cells in rows ROW[0] and ROW[1], which correspond to columns other than column COL, are not shown in FIG. 1D.

Memory cells 110A and 110B are two-port-eight-transistor (2P-8T) SRAM cells. A two-port memory cell includes a write port (e.g., write port WPA or WPB) and a read port (e.g., read port 114A or 114B). The read port includes a read data line that is configured to carry the data read from the memory cell through a read pass gate. The read pass gate is controlled by a read word line signal on a read word line. The write port includes a write data line that is configured to carry the data to be written to the memory cell through one or more write pass gates. The one or more write pass gates are controlled by a write word line signal on a write word line.

For example, memory cell 110A, illustrated as a representative memory cell, includes a 6T part 112A and a read port 114A. The 6T part 112A includes two P-type transistors P0 and P1 and two N-type transistors N0 and N1 forming a storage unit, and another two N-type transistors N2 and N3 as a part of the write port WPA. The read port 114A includes two other N-type transistors N4 and N5. The write port WPA is further associated with write word line WWL[0] and write bit lines WBL and WBLB. The read port 114A is further associated with read word line RWL[0] and read bit line RBL. Memory cell 110A further includes two power supply nodes VDD and VSS. Power supply node VDD is configured to have a first power supply voltage level corresponding to a logical high value. Power supply node VSS is configured to have a second power supply voltage level corresponding to a logical low value.

Transistors P0, P1, N0, and N1 form a pair of cross-coupled inverters between power supply nodes VDD and VSS. Transistors P0 and N0 form a first inverter while transistors P1 and N1 form a second inverter. Drains of transistors P0 and N0 are coupled together and form a data node MT. Drains of transistors P1 and N1 are coupled together and form a data node MB. Gates of transistors P0 and N0 are coupled together and to drains of transistors P1 and N1. Gates of transistors P1 and N1 are coupled together and to drains of transistors P0 and N0.

Transistor N2 is coupled with bit line WBL at an access node AN1 and with data node MT. Transistor N3 is coupled between bit line WBLB at an access node AN2 and with data node MB. Write word line WWL[0] is coupled with gates of transistors N2 and N3. In some embodiments, bit lines WBL, WBLB, and RBL are also shared by other memory cells (e.g., memory cell 110B) in column COL. Transistors N2 and N3 function as pass gates controlled by write word line WWL[0]. In some embodiments, write word line WWL[0] is also coupled with gates of transistors corresponding to transistors N2 and N3 in other memory cells in row ROW[0].

In some embodiments, memory circuit 100 includes a plurality of write data lines each being coupled to access nodes corresponding to access node AN1 of the corresponding column of the columns of memory cells, and a plurality of write data lines each being coupled to access nodes corresponding to access node AN2 of the corresponding column of the columns of memory cells.

Write word line WWL[0] is also called a write control line because the signal on write word line WWL[0] controls transistors N2 and N3 for data on write bit lines WBL and WBLB to be written to corresponding nodes MT and MB.

When memory cell 110A is accessed for a write operation, data to be written to memory cell 110A is applied to write bit lines WBL and WBLB. Write word line WWL[0] is then activated, such as being set to have the logical high value, to turn on transistors N2 and N3. As a result, the data on write bit lines WBL and WBLB is transferred to and is stored in corresponding data nodes MT and MB.

Transistor N4 has a source coupled to power supply node VSS, a gate coupled to data node MB, and a drain coupled to transistor N5. Transistor N4 is configured to be turned off when the gate of transistor N4 has a voltage level corresponding to the logical low value, and to be turned on when the gate of transistor N4 has a voltage level corresponding to the logical high value. Transistor N4 functions as a pulling device configured to selectively couple the intermediate node IN1 to the power supply node VSS responsive to the voltage level at data node MB.

Transistor N5 is coupled with read bit line RBL at an access node AN3 and with the drain of transistor N4. Read word line RWL[0] is coupled with a gate of transistor N5. Transistor N5 functions as a read pass gate controlled by read word line RWL[0]. In some embodiments, read word line RWL[0] is also coupled with gates of transistors corresponding to transistor N5 in other memory cells in row ROW[0].

When memory cell 110A is accessed for a read operation, read bit line is precharged to a voltage level corresponding to the logical high value. Then, read word line RWL[0] is activated, such as being set to have the logical high value, to turn on transistor N5, and the drain of transistor N4 and read bit line RBL are electrically coupled together at the intermediate node IN1. If data node MB has a voltage level corresponding to the logical low value, transistor N4 is turned off and read bit line RBL remains at a logical high level. If data node MB has a voltage level corresponding to the logical high value, transistor N4 is turned on and pulls read bit line RBL toward the voltage level at the power supply node VSS. Thus, transistor N5, working in conjunction with transistor N4, is configured to selectively alter a voltage level at the access node AN3 according to a voltage level at the data node MB if transistor N5 is turned on.

For example, memory cell 110B, illustrated as a representative memory cell, also includes a 6T part 112B and a read port 114B. The 6T part 112B includes two P-type transistors P10 and P11 and two N-type transistors N10 and N11 forming a storage unit, and another two N-type transistors N12 and N13 as a part of the write port WPB. The read port 114B includes another two N-type transistors N14 and N15. The write port WPB is further associated with write word line WWL[1] and write bit lines WBL and WBLB. The read port 114B is further associated with read word line RWL[1] and read bit line RBL. Memory cell 110B also includes two power supply nodes VDD and VSS. Power supply node VDD is configured to have a first power supply voltage level corresponding to a logical high value. Power supply node VSS is configured to have a second power supply voltage level corresponding to a logical low value. Transistors in the memory cell 110B have configurations similar to those of memory cell 110A, and detailed description thereof is thus omitted.

Figure 2:
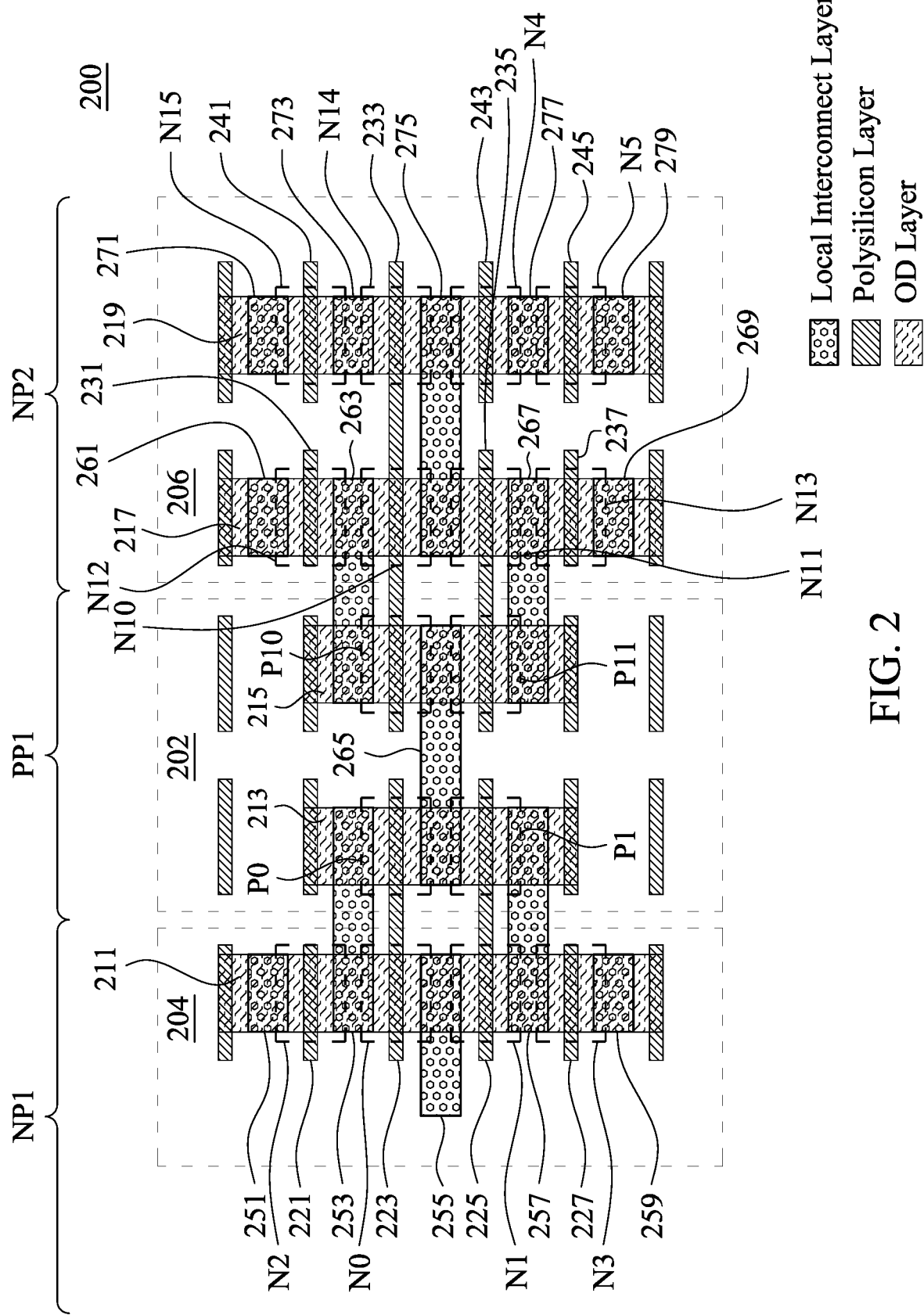
FIGS. 2-4, and 5A-5C are layout diagrams of a portion of a memory circuit in accordance with some embodiments of the present disclosure.

FIG. 2 is a layout diagram 200 of a portion of a memory circuit in accordance with some embodiments, which illustrates lower layers (e.g., oxide-definition regions, gate layers, and interconnection layers) of the layout. The memory cells in FIG. 2 are based on memory cells 110A and 110B in FIG. 1D and are usable to illustrate layout designs of other memory cells in the memory circuit 100 of FIG. 1D.

Layout diagram 200 includes a p-plus (PP) region PP1 associated with an N-well region 202 and NP (NP) regions NP1, NP2 respectively associated with two P substrate or P-well regions (hereinafter "P-well region") 204 and 206. Layout diagram 200 further includes an oxide-definition (OD) region 211 indicating N-type implantation regions buried in P-well region 204, OD regions 213 and 215 indicating P-type implantation regions buried in N-well region 202, and oxide-definition (OD) regions 217, and 219 indicating N-type implantation regions buried in P-well region 206. In some embodiments, the OD regions 211-219 refer to the active area.

Layout diagram 200 also includes polysilicon regions 221, 223, 225, 227, 231, 233, 235, 237, 241, 243, and 245, and interconnection regions 251, 253, 255, 257, 259, 261, 263, 265, 267, 269, and 271, 273, 275, 277, and 279. In some embodiments, interconnection regions 251-279 correspond to conductive structures of a common layer. A person having ordinary skill in the art would appreciate that one or more of the layout patterns described herein can be used to prepare a set of masks, which can in turn be used for manufacturing a memory cell in an integrated circuit. The layout diagram 200 is a basis to be modified to form other layout structures, such as those described herein.

Transistors corresponding to NMOS transistors N0, N1, N2 and N3 for the memory cell 110A in FIG. 1D are defined in the first N-type implantation region (e.g., area NP1) including OD region 211.

In this embodiment, interconnection structure 253, polysilicon region 223, OD region 211, and interconnection structure 255 define the NMOS transistor N0 (as shown in FIG. 1D). Polysilicon region 223 corresponds to the gate of NMOS transistor N0, interconnection structure 255 corresponds to a node to be connected with the power supply node VSS, and interconnection structure 253 corresponds to data node MT in the corresponding cell 110A. The gate of NMOS transistor N0 and PMOS transistor P0 are directly connected by polysilicon region 223. Interconnection structure 255, polysilicon region 225, OD region 211, and interconnection structure 257 define the NMOS transistor N1 (as shown in FIG. 1D). Polysilicon region 225 corresponds to the gate of NMOS transistor N1, and interconnection structure 257 corresponds to data node MB in the corresponding cell 110A. The gate of NMOS transistor N1 and PMOS transistor P1 are directly connected by polysilicon region 225.

Interconnection structure 251, polysilicon region 221, OD region 211, and interconnection structure 253 define the NMOS transistor N2 (as shown in FIG. 1D). Polysilicon region 221 corresponds to the gate of NMOS transistor N2, interconnection structure 251 corresponds to a node to be connected with the write bit line WBL. Interconnection structure 257, polysilicon region 227, OD region 211, and interconnection structure 259 define the NMOS transistor N3 (as shown in FIG. 1D). Polysilicon region 227 corresponds to the gate of NMOS transistor N3, interconnection structure 259 corresponds to a node to be connected with write bit line WBLB.

Transistors corresponding to PMOS transistors P0, P1, P10 and P11 for both memory cells 110A and 110B in FIG. 1D are defined in the P-type implantation region (e.g., area PP1) including OD regions 213 and 215.

In this embodiment, interconnection structure 253, polysilicon region 223, OD region 213, and interconnection structure 265 define PMOS transistor P0 (as shown in FIG. 1D). Polysilicon region 223 corresponds to the gate of PMOS transistor P0, interconnection structure 265 corresponds to a node to be connected with the power supply node VDD. Interconnection structure 257, polysilicon region 225, OD region 213, and interconnection structure 265 define PMOS transistor P1 (as shown in FIG. 1D). Polysilicon region 225 corresponds to the gate of PMOS transistor P1.

Interconnection structure 263, polysilicon region 233, OD region 215, and interconnection structure 265 define PMOS transistor P10 (as shown in FIG. 1D). Polysilicon region 233 corresponds to the gate of PMOS transistor P10, and interconnection structure 263 corresponds to the data node MT2 in the corresponding cell 110B. Interconnection structure 267, polysilicon region 235, OD region 215, and interconnection structure 265 define PMOS transistor P11 (as shown in FIG. 1D). Polysilicon region 235 corresponds to the gate of PMOS transistor P11, and interconnection structure 267 corresponds to the data node MB2 in the corresponding cell 110B.

Transistors corresponding to NMOS transistors N10, N11, N12 and N13 for the memory cell 110B in FIG. 1D are defined in the second N-type implantation region (e.g., area NP2) including OD regions 217 and 219.

In this embodiment, interconnection structure 263, polysilicon region 233, OD region 217, and interconnection structure 275 define NMOS transistor N10 (as shown in FIG. 1D). Polysilicon region 233 corresponds to the gate of NMOS transistor N10. As shown in FIG. 2, the gates of NMOS transistors N10, N14, and PMOS transistor P10 are directly connected by polysilicon region 233. Interconnection structure 275 corresponds to a node to be connected with the power supply node VSS.

Interconnection structure 275, polysilicon region 235, OD region 217, and interconnection structure 267 define NMOS transistor N11 (as shown in FIG. 1D). Polysilicon region 235 corresponds to the gate of NMOS transistor N11. As shown in FIG. 2, the gates of NMOS transistor N11 and PMOS transistor P11 are directly connected by polysilicon region 235.

Interconnection structure 261, polysilicon region 231, OD region 217, and interconnection structure 263 define NMOS transistor N12 (as shown in FIG. 1D). Polysilicon region 231 corresponds to the gate of NMOS transistor N12, interconnection structure 261 corresponds to a node to be connected with the write bit line WBL.

Interconnection structure 267, polysilicon region 237, OD region 217, and interconnection structure 269 define NMOS transistor N13 (as shown in FIG. 1D). Polysilicon region 237 corresponds to the gate of NMOS transistor N13, interconnection structure 269 corresponds to a node to be connected with the write bit line WBLB.

In addition, transistors corresponding to NMOS transistors N4, N5, N14, and N15 in the read ports for both memory cells 110A and 110B in FIG. 1D are also defined in the second N-type implantation region (e.g., area NP2) including OD regions 217 and 219.

Interconnection structure 275, polysilicon region 243, OD region 219, and interconnection structure 277 define NMOS transistor N4 (as shown in FIG. 1D). Polysilicon region 243 corresponds to the gate of NMOS transistor N4. Interconnection structure 277, polysilicon region 245, OD region 219, and interconnection structure 279 define NMOS transistor N5 (as shown in FIG. 1D). Polysilicon region 245 corresponds to the gate of NMOS transistor N5, interconnection structure 279 corresponds to a node to be connected with the read bit line RBL. The NMOS transistors N4 and N5 are connected by interconnection structure 277.

Interconnection structure 273, polysilicon region 233, OD region 219, and interconnection structure 275 define NMOS transistor N14 (as shown in FIG. 1D). Polysilicon region 233 corresponds to the gate of NMOS transistor N14. Interconnection structure 271, polysilicon region 241, OD region 219, and interconnection structure 273 define NMOS transistor N15 (as shown in FIG. 1D). Polysilicon region 241 corresponds to the gate of NMOS transistor N15. Interconnection structure 271 corresponds to a node to be connected with the read bit line RBL. The NMOS transistors N14 and N15 are connected by interconnection structure 273.

Figure 3:
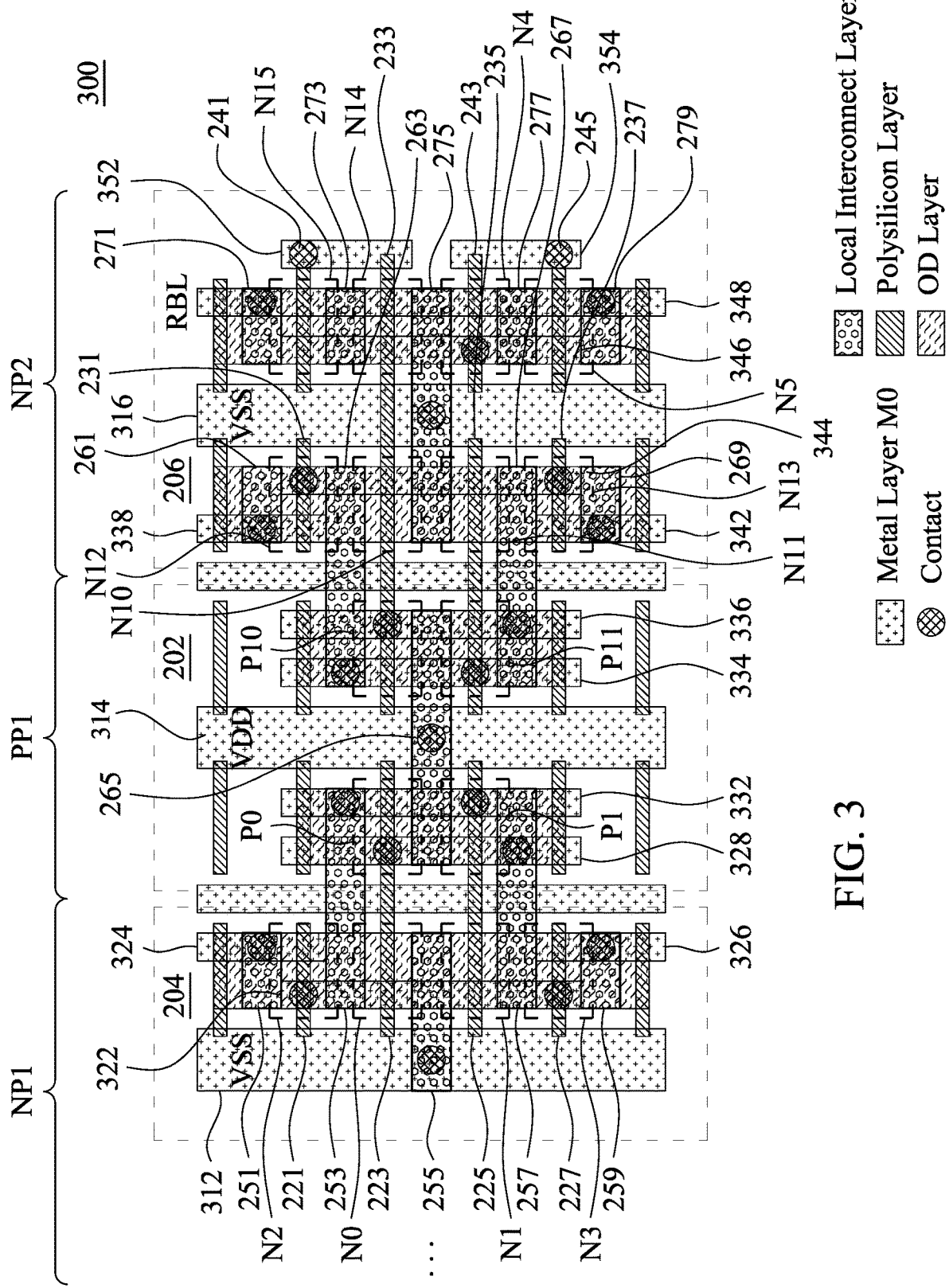

FIG. 3 is a layout diagram 300 of a portion of a memory circuit in accordance with some embodiments, which illustrates lower layers and middle layers (e.g., the contacts and the first metal layer M0) of the layout. The memory cells in FIG. 3 are based on memory cells 110A and 110B in FIG. 1D, and based on the lower layers illustrated in layout diagram 200 of FIG. 2.

As shown in FIG. 3, the first metal layer M0 may include power rails 312, 314, and 316, and metal line features 322-354.

The first power rail 312 lies within the first N-type transistor area NP1 and is configured to couple the SRAM cell to a first DC power supply, such as the power supply node VSS for example. The second power rail 314 lies within the P-type transistor area PP1 and is in parallel with the first power rail 312. In addition, from the top view illustrated in FIG. 3, the second power rail 314 is sandwiched between OD regions 213 and 215 in the P-type transistor area PP1. The second power rail 314 is configured to couple the SRAM cell to a second DC power supply, such as the power supply node VDD, for example. The third power rail 316 lies within the second N-type transistor area NP2 and is in parallel with the first power rail 312 and the second power rail 314. The third power rail 316 is also configured to couple the SRAM cell layout 300 to the first DC power supply, such as the power supply node VSS for example. In addition, from the top view illustrated in FIG. 3, the third power rail 316 is sandwiched between OD regions 217 and 219 in the second N-type transistor area NP2.

As shown in FIG. 3, a contact extends downwardly from the power rail 312 to the interconnection structure 255 in the local interconnect layer to couple corresponding source/drain regions of transistors N0 and N1 to the power supply node VSS. A contact extends downwardly from the power rail 314 to the interconnection structure 265 in the local interconnect layer to couple corresponding source/drain regions of transistors P0, P1, P10, and P11 to the power supply node VDD. A contact extends downwardly from the power rail 316 to the interconnection structure 275 in the local interconnect layer to couple corresponding source/drain regions of transistors N4, N14, N10 and N11 to the power supply node VSS.

The metal line feature 322 corresponds to a node to be connected with the write word line WWL[0] for the memory cell 110A. Contacts separately extend downwardly from the metal line feature 322 to couple the gate regions of the transistors N2 and N3 together.

The metal line features 324, 326 separately correspond to nodes to be respectively connected with the write bit lines WBL and WBLB. Contacts extend downwardly from the metal line features 324, 326 to respectively couple the corresponding source/drain regions of transistors N2 and N3 to the metal line features 324, 326.

The metal line feature 328 corresponds to the data node MB. Contacts separately extend downwardly from the metal line feature 328 to couple the gate region of the transistor P0 and the interconnection structure 257 (corresponding source/drain region of the transistor P1) together.

The metal line feature 332 corresponds to the data node MT. Contacts separately extend downwardly from the metal line feature 332 to couple the gate region of the transistor P1 and the interconnection structure 253 (corresponding source/drain region of the transistor P0) together.

The metal line feature 334 corresponds to the data node MT2. Contacts separately extend downwardly from the metal line feature 334 to couple the gate region of the transistor P11 and the interconnection structure 263 (corresponding source/drain region of the transistor P10) together.

The metal line feature 336 corresponds to the data node MB2. Contacts separately extend downwardly from the metal line feature 336 to couple the gate region of the transistor P10 and the interconnection structure 267 (corresponding source/drain region of the transistor P11) together.

The metal line features 338, 342 separately correspond to nodes to be respectively connected with the write bit lines WBL and WBLB. Contacts extend downwardly from the metal line features 338, 342 to respectively couple the corresponding source/drain regions of transistors N12 and N13 to the metal line features 338, 342.

The metal line feature 344 corresponds to a node to be connected with the write word line WWL[1] for the memory cell 110B. Contacts separately extend downwardly from the metal line feature 344 to couple the gate regions of the transistors N12 and N13 together.

The metal line feature 346 corresponds to a node to be connected with the data node MB. A contact extends downwardly from the metal line feature 346 to couple the gate region of the transistor N4 to the metal line feature 346.

The metal line feature 348 corresponds to the read bit line RBL. Contacts separately extend downwardly from the metal line feature 348 to couple the corresponding source/drain regions of transistors N5 and N15 together.

The metal line features 352, 354 separately correspond to nodes to be respectively connected with the read word lines RWL[1] and RWL[0] for memory cells 110B and 110A. Contacts extend downwardly from the metal line features 352, 354 to respectively couple the gate regions of transistors N15 and N5 to the metal line features 352, 354.

Figure 4:
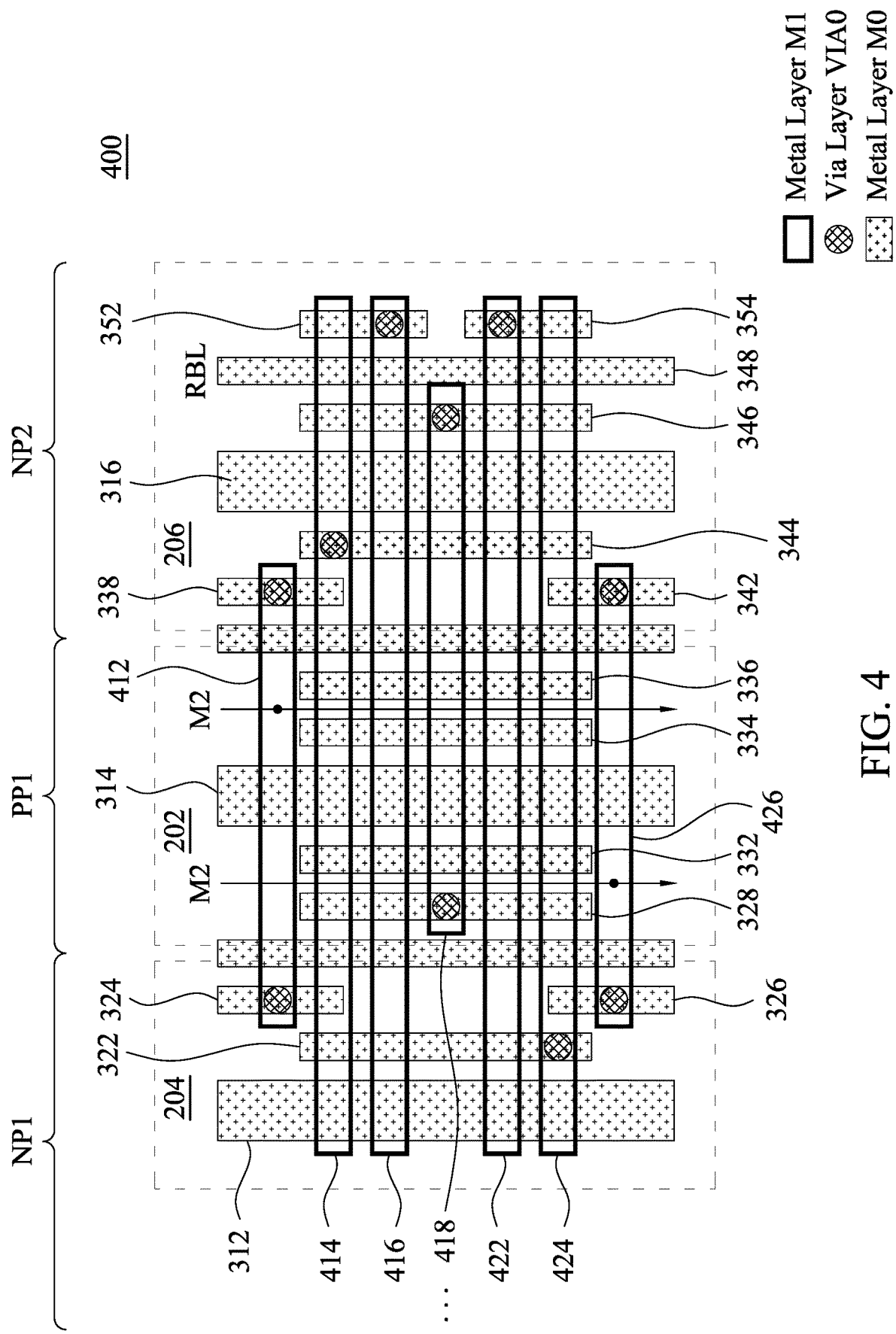

FIG. 4 is a layout diagram 400 of a portion of a memory circuit in accordance with some embodiments, which illustrates middle layers and upper layers (e.g., the second metal layer M1, and the via layer VIA0 between metal layers M0 and M1) of the layout. The memory cells in FIG. 4 are based on memory cells 110A and 110B in FIG. 1D, and based on the layers illustrated in layout diagrams 200, 300 of FIG. 2 and FIG. 3.

As shown in FIG. 4, the second metal layer M1 may include metal line features 412-426 being perpendicular to metal line features in the first metal layer M0.

The metal line feature 412 corresponds to the write bit line WBL, and is connected to metal line features 324 and 338 in the first metal layer M0 through corresponding via structures.

The metal line feature 414 corresponds to the write word line WWL[1] and is connected to the metal line feature 344 in the first metal layer M0 through a corresponding via structure.

The metal line feature 416, which corresponds to the read word line RWL[1], is connected to the metal line feature 352 in the first metal layer M0 through a corresponding via structure.

The metal line feature 418, which corresponds to the data node MB, is connected to metal line features 328 and 346 in the first metal layer M0 through corresponding via structures.

The metal line feature 422, which corresponds to the read word line RWL[0], is connected to the metal line feature 354 in the first metal layer M0 through a corresponding via structure.

The metal line feature 424, which corresponds to the write word line WWL[0], is connected to the metal line feature 322 in the first metal layer M0 through a corresponding via structure.

The metal line feature 426, which corresponds to the write bit line WBLB, is connected to the metal line features 326 and 342 in the first metal layer M0 through corresponding via structures.

Figure 5A:
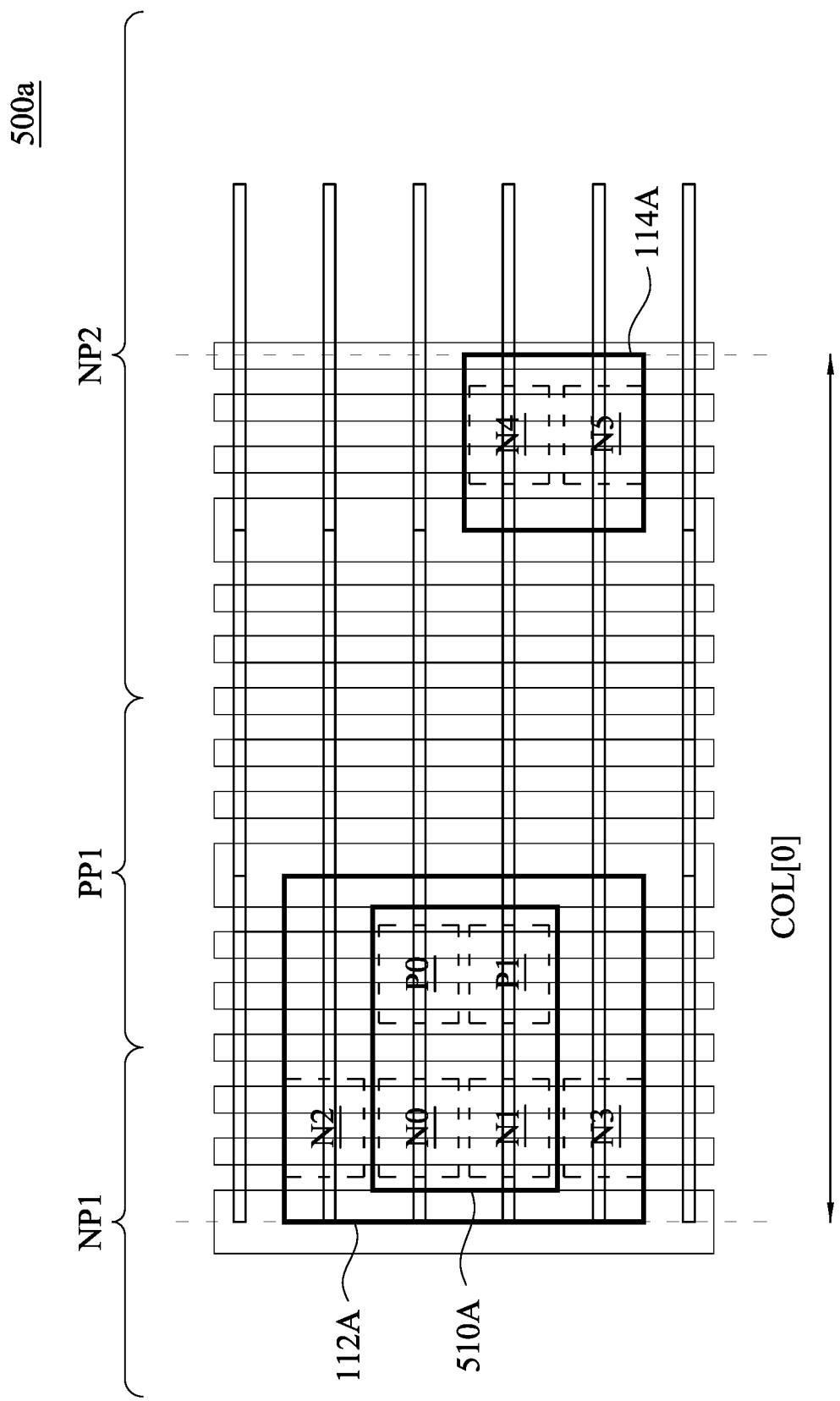

FIG. 5A is a layout diagram 500a of a portion of a memory circuit in accordance with some embodiments, which illustrates arrangements of transistors N0-N3, P0, and P1 within the 6T part 112A and transistors N4 and N5 within the read port 114A of memory cell 110A of FIG. 1D according to the layout illustrated in FIGS. 2-4. As shown in FIG. 5A, transistors N2, N3 within the write port in the 6T part 112A are formed in a first doping region (e.g. NP region NP1). Transistors N4, N5 within the read port 114A are formed in a second doping region (e.g. NP region NP2). The first doping region and the second doping region are separated by a third doping region (e.g. p-plus region PP1).

In addition, the 6T part 112A overlaps the doping regions NP1 and PP1. In the 6T part 112A, n-type transistors N0, N1 within the storage unit 510A of the memory cell 110A are formed in the NP region NP1, and p-type transistors P0, P1 of the storage unit 510A are formed in the p-plus region PP1.

Figure 5B:
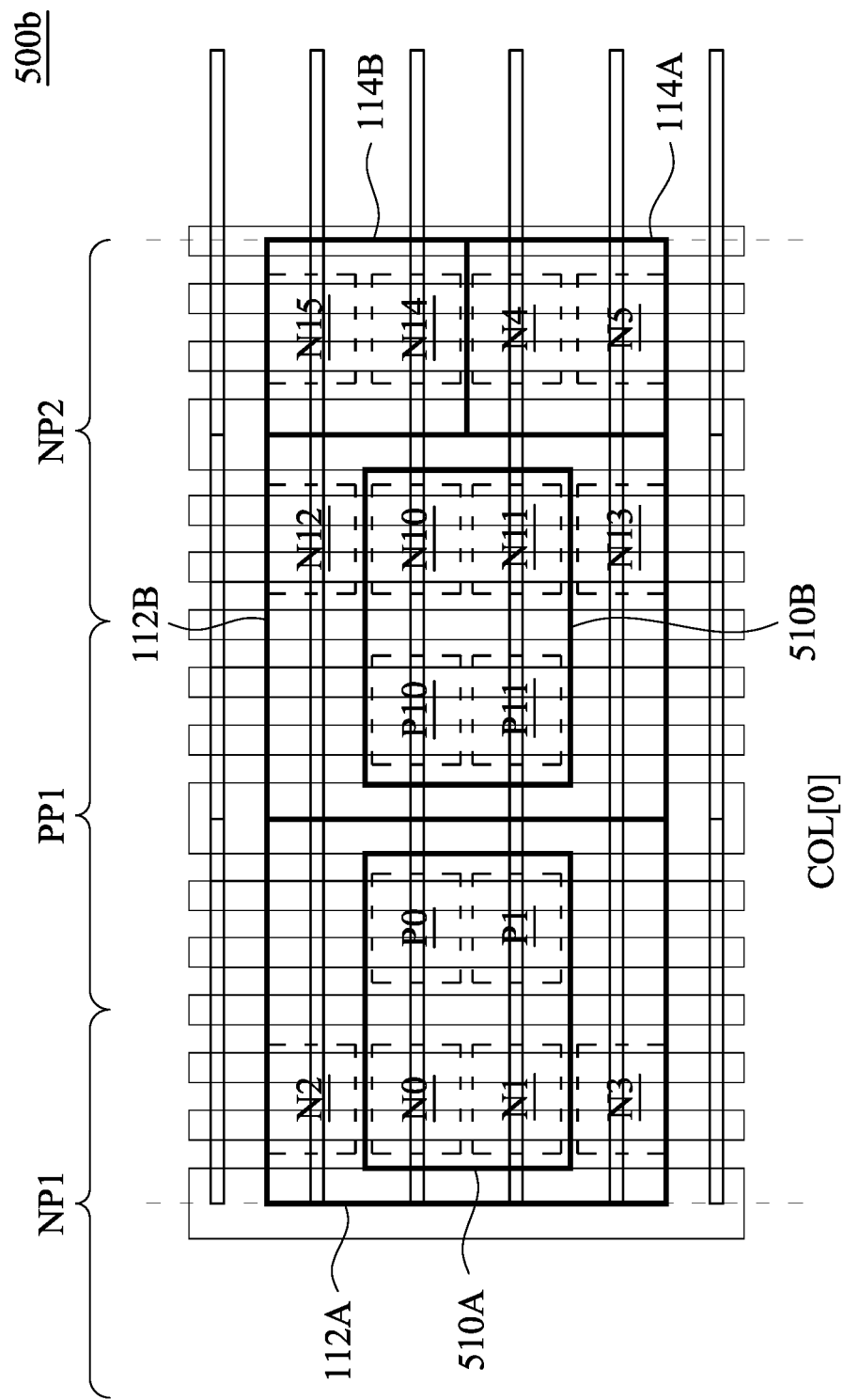

FIG. 5B is a layout diagram 500b of a portion of a memory circuit in accordance with some embodiments, which illustrates arrangements of transistors within the memory cells 110A and 110B of FIG. 1D according to the layout illustrated in FIGS. 2-4. As shown in FIG. 5B, the read port 114A is separated from the write port and the 6T part 112A by the 6T part 112B (including the write port) of the memory cell 110B, which is the memory cell in the adjacent row and the same column of memory cell 110A. Alternatively stated, the first read port (e.g., the read port 114A) associated with the memory cell 110A is separated from the first write port (e.g., the transistors N2 and N3), which is in the 6T part 112A, by the second write port (e.g., the transistors N12 and N13), which is in the 6T part 112B, of the memory cell 110B.

The 6T part 112B overlaps the doping regions NP2 and PP1. In the 6T part 112B, n-type transistors N10, N11 of the storage unit 510B are formed in the NP region NP2, and p-type transistors P10, P11 of the storage unit 510B are formed in the p-plus region PP1. As shown in FIG. 5B, transistors N12, N13 are formed in the write port in the 6T part 112B and in the second doping region (e.g. NP region NP2). Transistors N14, N15 forming the read port 114B are also formed in the second doping region (e.g. NP region NP2).

As discussed above, the read access transistors N5 and N15 in different memory cells are connected by one or more conductive features (e.g., metal line feature 348) in the conductive metal layer M0 formed over the transistors N5 and N15.

The write access transistors N2 and N12 in different memory cells are connected by one or more conductive features (e.g., metal line features 324, 338, 412) in one or more conductive metal layers M0 and M1 formed over the write access transistors N2 and N12. The write access transistors N3 and N13 in different memory cells are also connected by one or more conductive features (e.g., metal line features 326, 342, 426) in one or more conductive metal layers M0 and M1 formed over the write access transistors N3 and N13.

Figure 5C:
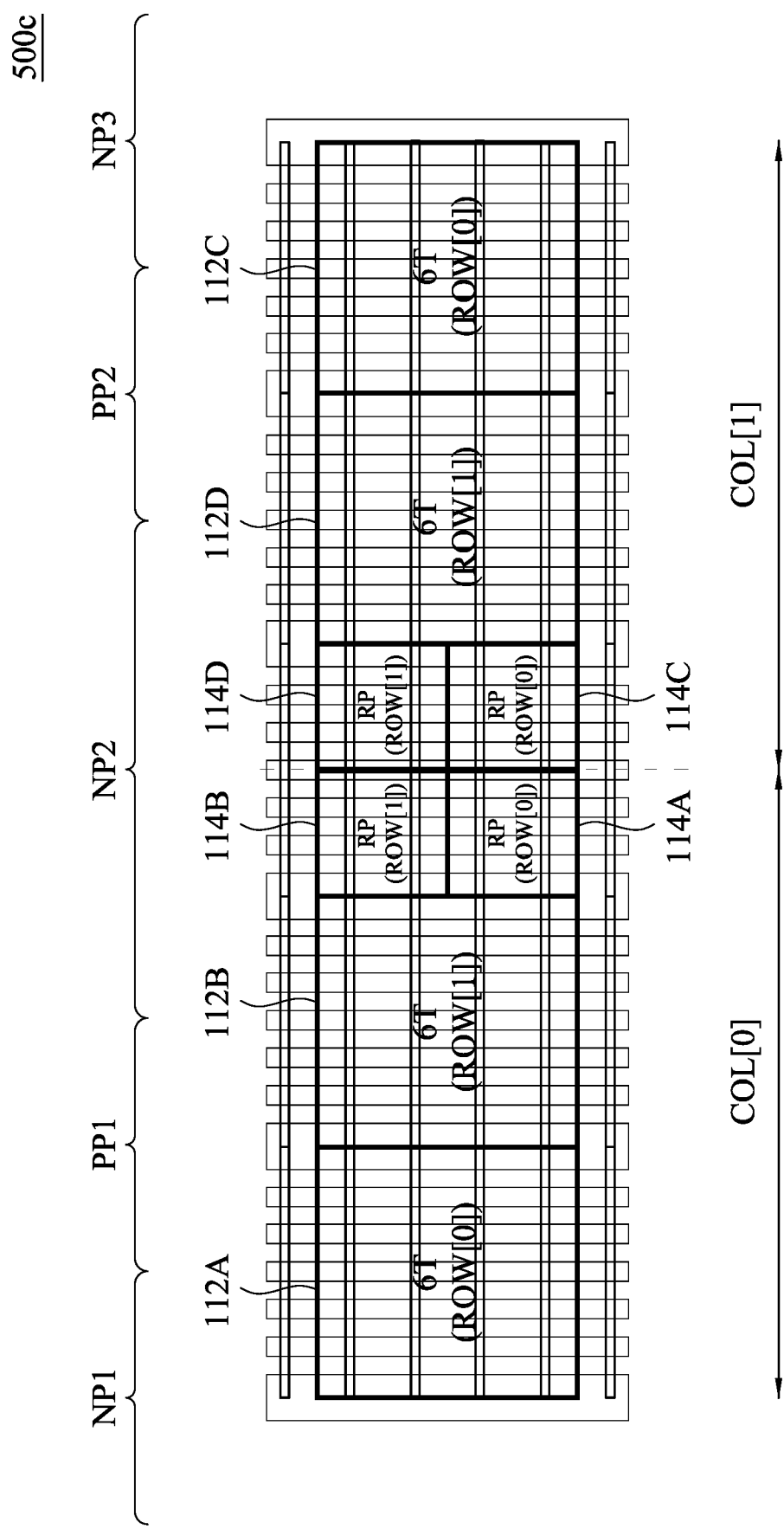

FIG. 5C is a layout diagram 500c of a portion of a memory circuit in accordance with some embodiments, which illustrates arrangements of the 6T parts and the read ports of memory cells corresponding to two rows ROW[0], ROW[1] and two columns COL[0], COL[1], according to the layout illustrated in FIGS. 2-4. As shown in FIG. 5C, in some embodiments, the read ports of memory cells in adjacent columns can be arranged in the same doping region in the layout.

For example, in addition to the 6T parts 112A, 112B and read ports 114A, 114B of the memory cells 110A and 110B corresponding to rows ROW[0], ROW[1] in the column COL[0], the layout diagram 500c further includes the 6T parts 112C, 112D and read ports 114C, 114D. The 6T part 112C and the read port 114C is part of a memory cell corresponding to the row ROW[0] and the column COL[1]. The 6T part 112D and the read port 114D is part of a memory cell corresponding to the row ROW[1] and the column COL[1]. The 6T part 112C overlaps the PP region PP2 and the NP region NP3, and 6T part 112D overlaps the NP region NP2 and the PP region PP2. The read ports 114A, 114B, 114C, and 114D of four memory cells are formed in the same NP region NP2 in the layout.

As shown in FIG. 5A-FIG. 5C, by placing transistors of 8T2P SRAM cells properly and separating the read port and the write port of the memory cell, the standard cell rules can be met for routing track assignment. Accordingly, the standard-cell-based design can be used to implement SRAM cells. In some embodiments, a smaller circuit area for SRAM cells can be achieved by using the standard-cell-based design when the array size is small.

Figure 5D:
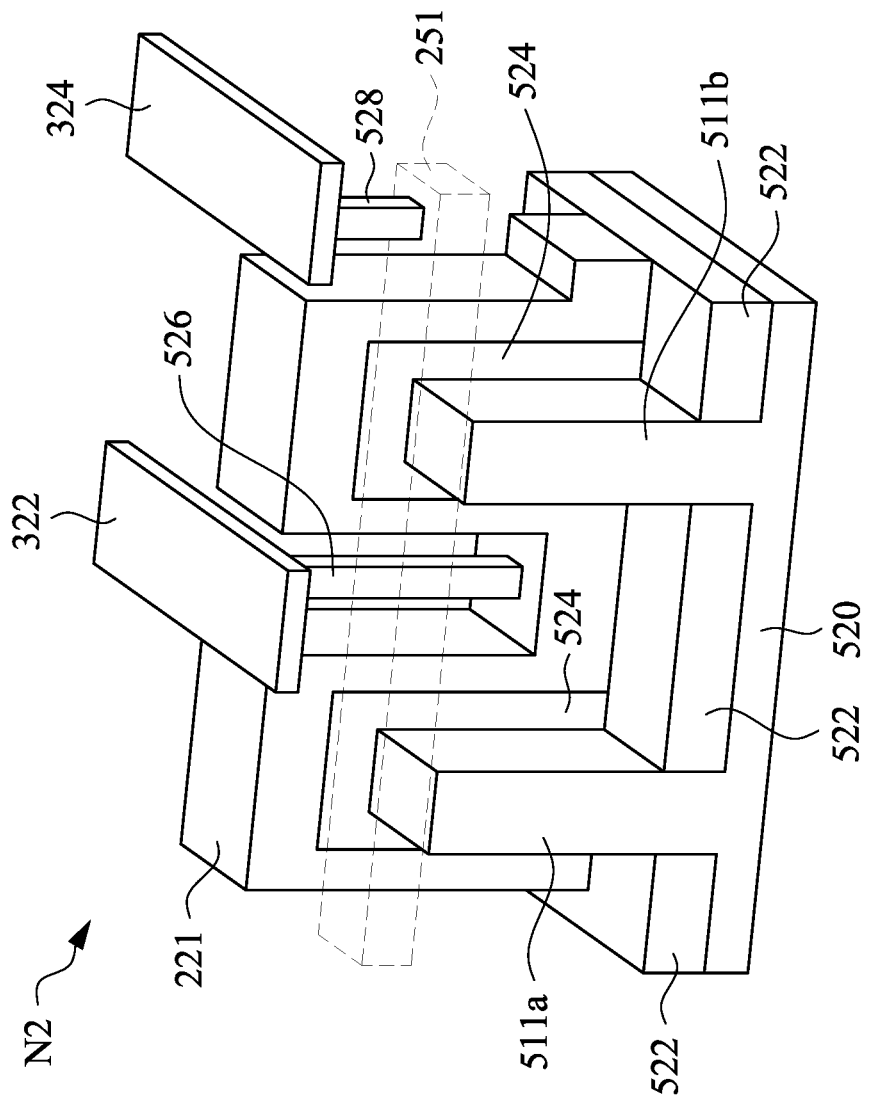
FIG. 5D shows a perspective view of an exemplary transistor in the SRAM cell in accordance with some embodiments of the present disclosure.

FIG. 5D shows a perspective view of an exemplary transistor (e.g., transistor N2) in the SRAM cell in accordance with some embodiments. The transistor N2 includes a pair of semiconductor fins 511a, 511b in the OD region 211 running parallel to one another over a semiconductor substrate 520. The fins 511a, 511b extend upwardly from the semiconductor substrate 520 through openings in an isolation region 522, such as a silicon dioxide or low-k dielectric layer (e.g., buried oxide (BOX) layer). The conductive gate electrode (e.g, 221) straddles both semiconductor fins 511*a*, 511*b*, and a gate dielectric 524, such as a SiO2 or high-k dielectric, separates the gate electrode from the semiconductor fins 511*a*, 511*b*. Contact 526 couples the gate electrode (e.g, 221) to the metal line feature 322 in the first metal layer M0. The local interconnect line (e.g., interconnection regions 251) shorts a first set of source/drain regions in the fins 511*a*, 511*b* on one side of the gate electrode to one another; and a second interconnect line (not shown in FIG. 5D) shorts a second set of source/drain regions in the fins 511*a*, 511*b* on the other side of the gate electrode to one another, such that the fins 511*a*, 511*b* act as a single finFET rather than two finFETs. A contact 528 connects the metal line feature 324 in the first metal layer M0 to the local interconnect layer (e.g., interconnection regions 251). In some embodiments, one or more vias (see FIG. 4; but not shown in FIG. 5D) connects metal line features 322, 324 in the first metal layer M0 to corresponding metal line features 424, 412 in the second metal layer M1.

Figure 6:
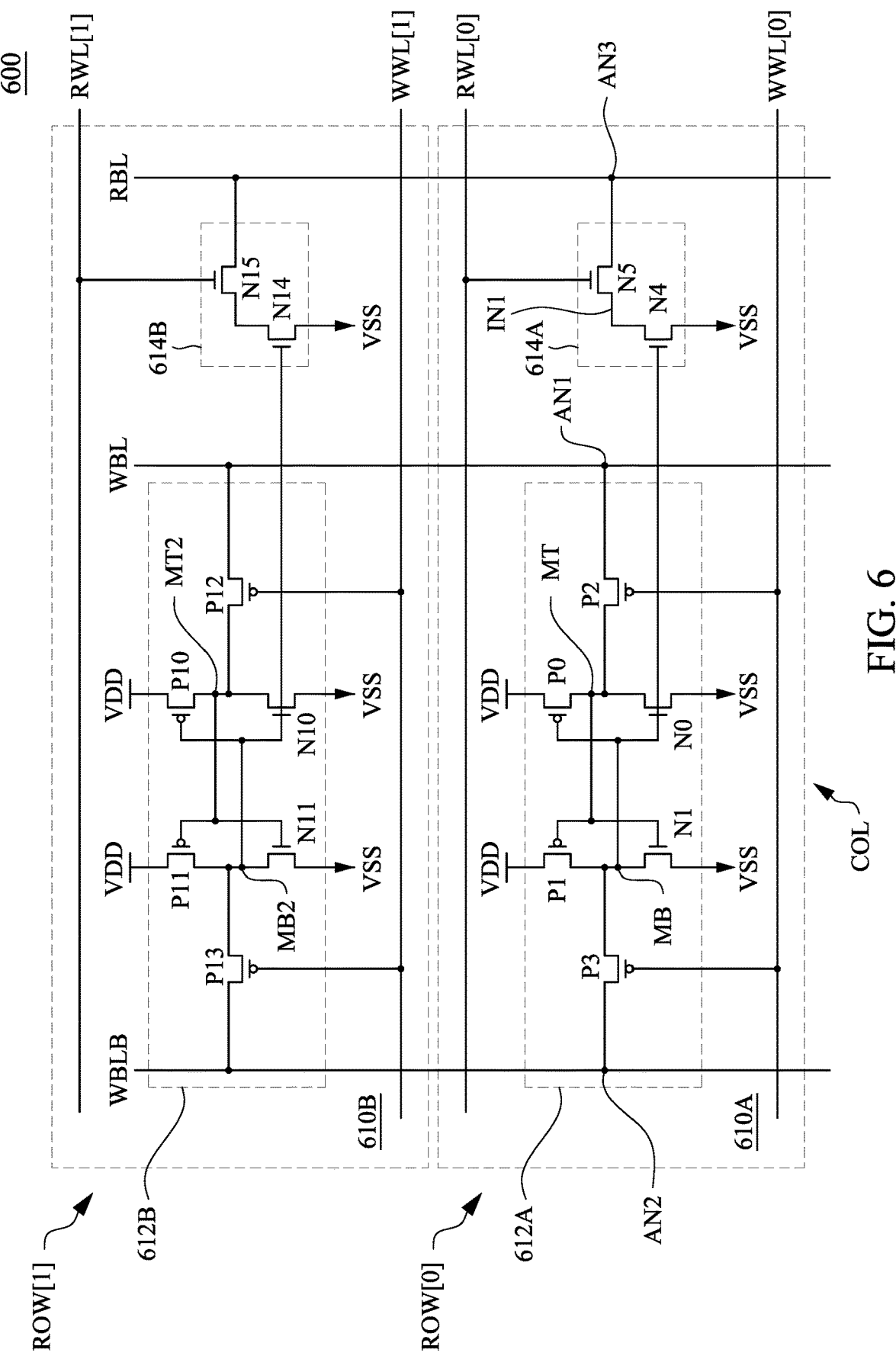
FIG. 6 is a circuit diagram of a portion of a memory circuit in accordance with some embodiments of the present disclosure.

FIG. 6 is a circuit diagram of a portion of a memory circuit 600 in accordance with some other embodiments. Compared with memory circuit 100 in FIG. 1D, the access transistors of the write ports in the memory circuit 600 are PMOS transistors (e.g., transistors P2, P3, P12, and P13) rather than the NMOS transistors (e.g., transistors N2, N3, N12 and N13) previously illustrated in the memory circuit 100 in FIG. 1D. Particularly, similar to FIG. 1D, the memory circuit 600 also includes memory cells arranged into columns and one or more pairs of adjacent rows. In the embodiments shown in FIG. 6, a memory cell 610A, illustrated as a representative memory cell, includes a 6T part 612A and a read port 614A. The 6T part 612A includes two P-type transistors P0 and P1 and two N-type transistors N0 and N1 forming a storage unit, and another two P-type transistors P2 and P3 as a part of the write port. The read port 614A includes another two N-type transistors N4 and N5. Similarly, a memory cell 610B, illustrated as another representative memory cell, includes a 6T part 612B and a read port 614B. The 6T part 612B includes two P-type transistors P10 and P11 and two N-type transistors N10 and N11 forming a storage unit, and another two P-type transistors P12 and P13 as a part of the write port. The read port 6148 of memory cell 6108 includes another two N-type transistors N14 and N15.

Compared with memory circuit 100 in FIG. 1D, N-type transistors N2 and N3 are replaced by P-type transistors P2 and P3. Moreover, N-type transistors N12 and N13 are further replaced by P-type transistors P12 and P13. Alternatively stated, the access transistors of the write ports are PMOS transistors rather than the NMOS transistors (e.g., transistors N2, N3, N12 and N13) previously illustrated in FIG. 1D.

Figure 7:
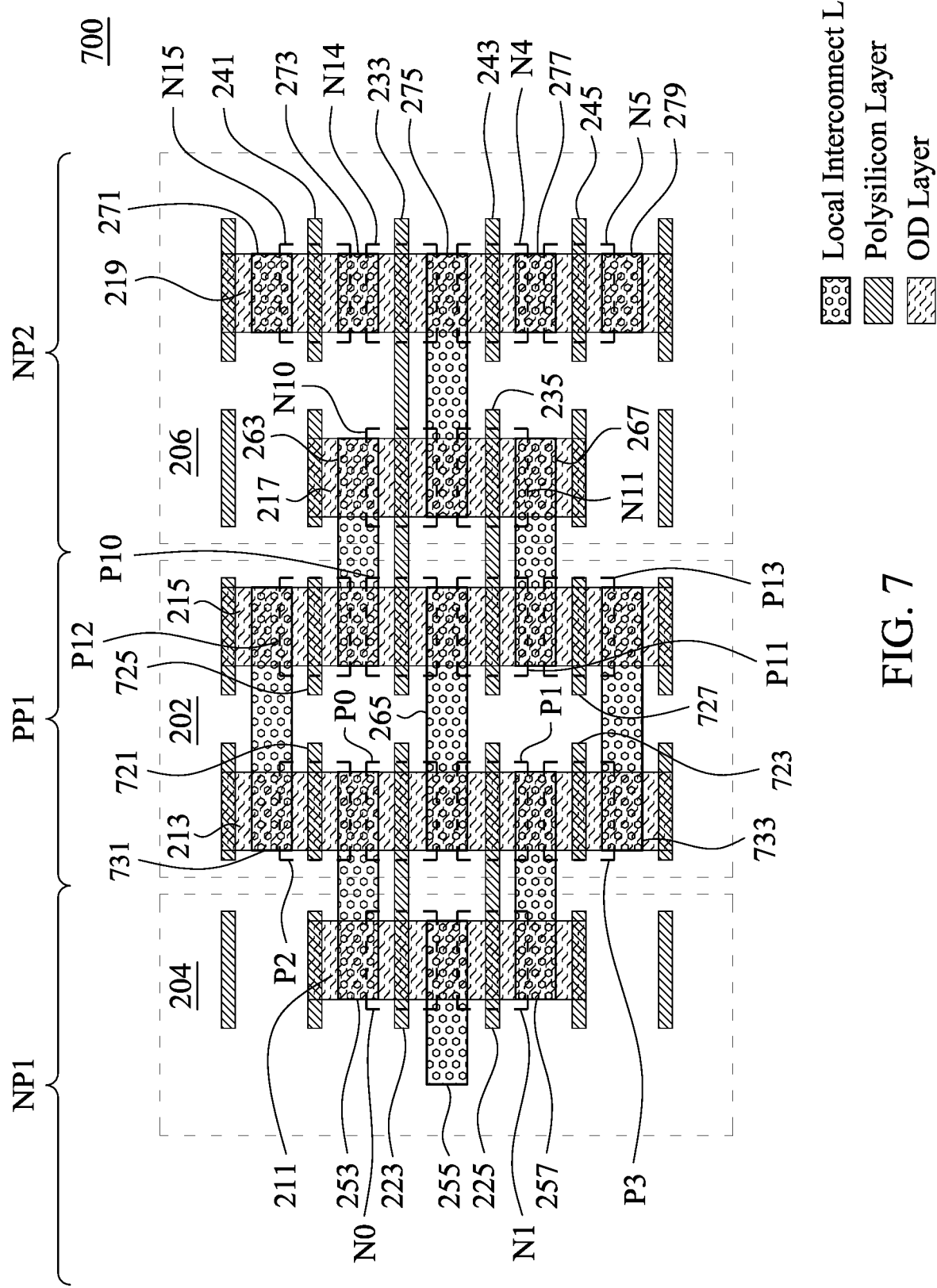
FIGS. 7-9, 10A and 10B are layout diagrams of a portion of a memory circuit in accordance with some embodiments of the present disclosure.

FIG. 7 is a layout diagram 700 of a portion of a memory circuit in accordance with some embodiments, which illustrates lower layers (e.g., oxide-definition regions, gate layers, and interconnection layers) of the layout. The memory cells in FIG. 7 are based on memory cells 610A and 610B in FIG. 6 and are usable to illustrate layout designs of other memory cells in the memory circuit 600 of FIG. 6. The components in FIG. 7 that are the same or similar to those depicted in FIGS. 2-5 are given the same reference labels, and the detailed description thereof is omitted.

Transistors corresponding to NMOS transistors N0, and N1 for the memory cell 610A in FIG. 6 are defined in the first N-type implantation region (e.g., area NP1) including OD region 211. Transistors corresponding to NMOS transistors N10, and N11 for the memory cell 610B in FIG. 6 are defined in the second N-type implantation region (e.g., area NP2) including OD regions 217 and 219. In addition, transistors corresponding to NMOS transistors N4, N5, N14, and N15 in the read ports for both memory cells 610A and 610B in FIG. 6 are also defined in the second N-type implantation region (e.g., area NP2) including OD regions 217 and 219. Configurations of the NMOS transistors N0, N1, N10, N11, N4, N5, N14, and N15 for memory cells 610A and 610B are similar to those for memory cells 110A and 110B in FIG. 1D, and thus the detailed description thereof is omitted.

Transistors corresponding to PMOS transistors P0, P1, P2, P3, P10, P11, P12, and P13 for both memory cells 610A and 610B in FIG. 6 are defined in the P-type implantation region (e.g., area PP1) including OD regions 213 and 215. Configurations of the PMOS transistors P0, P1, P10, and P11 for memory cells 610A and 610B are similar to those for memory cells 110A and 110B in FIG. 1D, and thus the detailed description thereof is omitted.

Layout diagram 700 further includes polysilicon regions 721-727, and interconnection regions 731, 733. Interconnection structure 731, polysilicon region 721, OD region 213, and interconnection structure 253 define the PMOS transistor P2 (as shown in FIG. 6). Polysilicon region 721 corresponds to the gate of PMOS transistor P2, interconnection structure 731 corresponds to a node to be connected with the write bit line WBL and connects PMOS transistor P2 and PMOS transistor P12. Interconnection structure 253 connects PMOS transistor P0 and PMOS transistor P2.

Interconnection structure 257, polysilicon region 723, OD region 213, and interconnection structure 733 define the PMOS transistor P3 (as shown in FIG. 6). Polysilicon region 723 corresponds to the gate of PMOS transistor P3, interconnection structure 733 corresponds to a node to be connected with write bit line WBLB and connects PMOS transistor P3 and PMOS transistor P13. Interconnection structure 257 connects PMOS transistor P1 and PMOS transistor P3.

Interconnection structure 731, polysilicon region 725, OD region 215, and interconnection structure 263 define the PMOS transistor P12 (as shown in FIG. 6). Polysilicon region 725 corresponds to the gate of PMOS transistor P12. Interconnection structure 263 connects PMOS transistor P10 and PMOS transistor P12.

Interconnection structure 267, polysilicon region 727, OD region 215, and interconnection structure 733 define the PMOS transistor P13 (as shown in FIG. 6). Polysilicon region 727 corresponds to the gate of PMOS transistor P13. Interconnection structure 267 connects PMOS transistor P11 and PMOS transistor P13.

Figure 8:
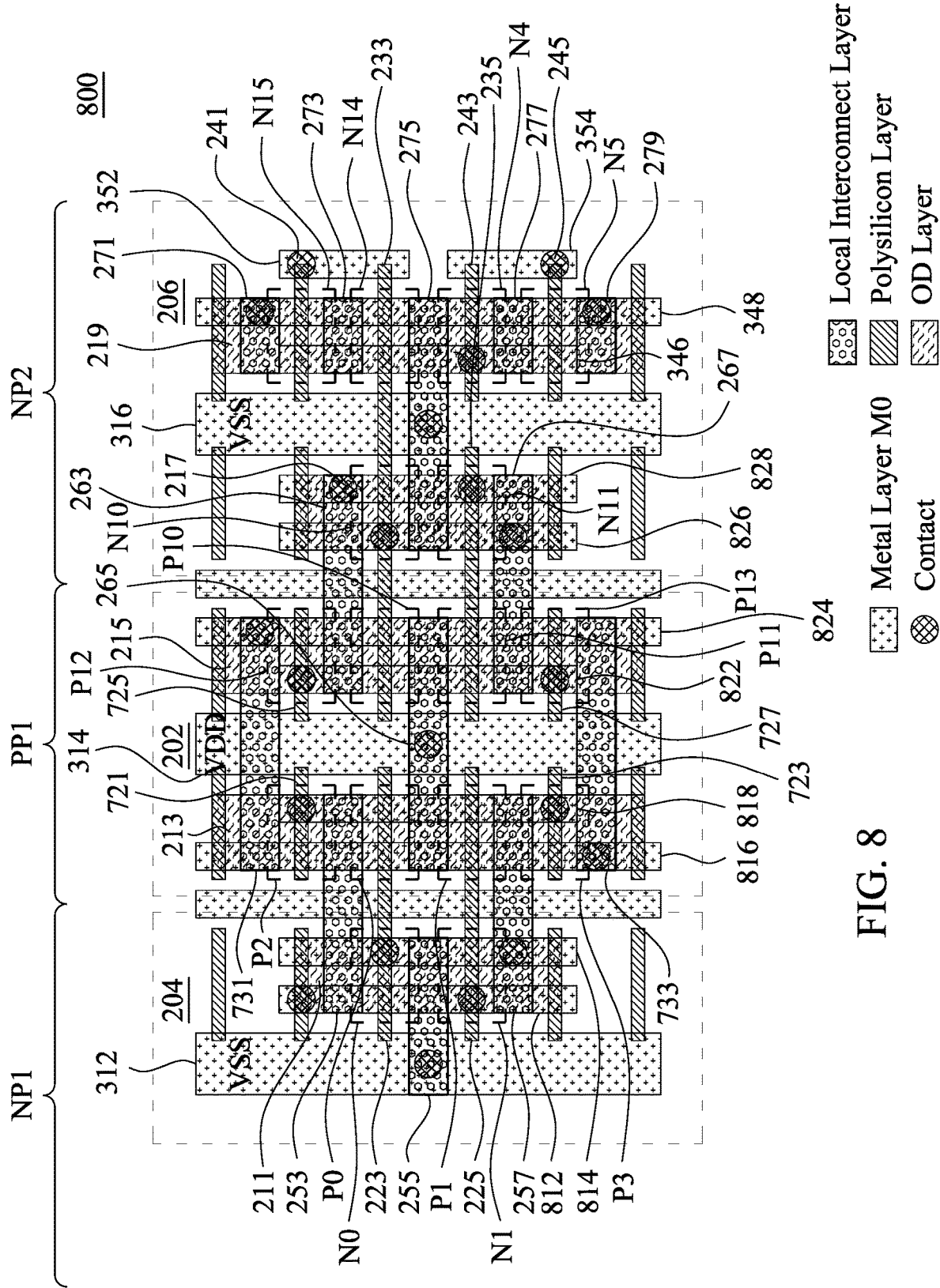

FIG. 8 is a layout diagram 800 of a portion of a memory circuit in accordance with some embodiments, which illustrates lower layers and middle layers (e.g., the contacts and the first metal layer M0) of the layout. The memory cells in FIG. 8 are based on memory cells 610A and 610B in FIG. 6, and based on the lower layers illustrated in layout diagram 700 of FIG. 7. The components in FIG. 8 that are the same or similar to those depicted in FIGS. 2-5 are given the same reference labels, and the detailed description thereof is omitted.

As shown in FIG. 8, the first metal layer M0 may include power rails 312, 314, and 316, and metal line features 322-354. Configurations of the power rails 312, 314, and 316 and the contacts thereof corresponding to the power supply nodes VSS and VDD for memory cells 610A and 610B are similar to those illustrated in layout diagram 300 of FIG. 3, and thus the detailed description thereof is omitted. Configurations of the metal line features 346-354 and the contacts thereof corresponding to the read ports for memory cells 610A and 6108 are similar to those illustrated in layout diagram 300 of FIG. 3, and thus the detailed description thereof is omitted.

Compared to the layout diagram 300 of FIG. 3, in the embodiments of FIG. 8, arrangements of metal line features 812-828 in the first metal layer M0 are modified to achieve memory cells 610A and 610B using PMOS transistors as the access transistors of the read port (e.g., transistors P2, P3, P12 and P13).

The metal line feature 812 corresponds to the data node MT. Contacts separately extend downwardly from the metal line feature 812 to couple the gate region of the transistor P1 and the interconnection structure 253 (corresponding source/drain region of the transistor P0) together.

The metal line feature 814 corresponds to the data node MB. Contacts separately extend downwardly from the metal line feature 814 to couple the gate region of the transistor P0 and the interconnection structure 257 (corresponding source/drain region of the transistor P1) together.

The metal line feature 816 corresponds to a node to be connected with the write bit line WBLB. A contact extends downwardly from the metal line feature 816 to couple the interconnection regions 733 (corresponding source/drain regions of transistors P3 and P13) to the metal line feature 816.

The metal line feature 818 corresponds to a node to be connected with the write word line WWL[0] for the memory cell 110A. Contacts separately extend downwardly from the metal line feature 818 to couple the gate regions of the transistors P2 and P3 together.

The metal line feature 822 corresponds to a node to be connected with the write word line WWL[1] for the memory cell 110B. Contacts separately extend downwardly from the metal line feature 822 to couple the gate regions of the transistors P12 and P13 together.

The metal line feature 824 corresponds to a node to be connected with the write bit line WBL. A contact extends downwardly from the metal line feature 824 to couple the interconnection regions 731 (corresponding source/drain regions of transistors P2 and P12) to the metal line feature 824.

The metal line feature 826 corresponds to the data node MB2. Contacts separately extend downwardly from the metal line feature 826 to couple the gate region of the transistor P10 and the interconnection structure 267 (corresponding source/drain region of the transistor P11) together.

The metal line feature 828 corresponds to the data node MT2. Contacts separately extend downwardly from the metal line feature 828 to couple the gate region of the transistor P11 and the interconnection structure 263 (corresponding source/drain region of the transistor P10) together.

Figure 9:
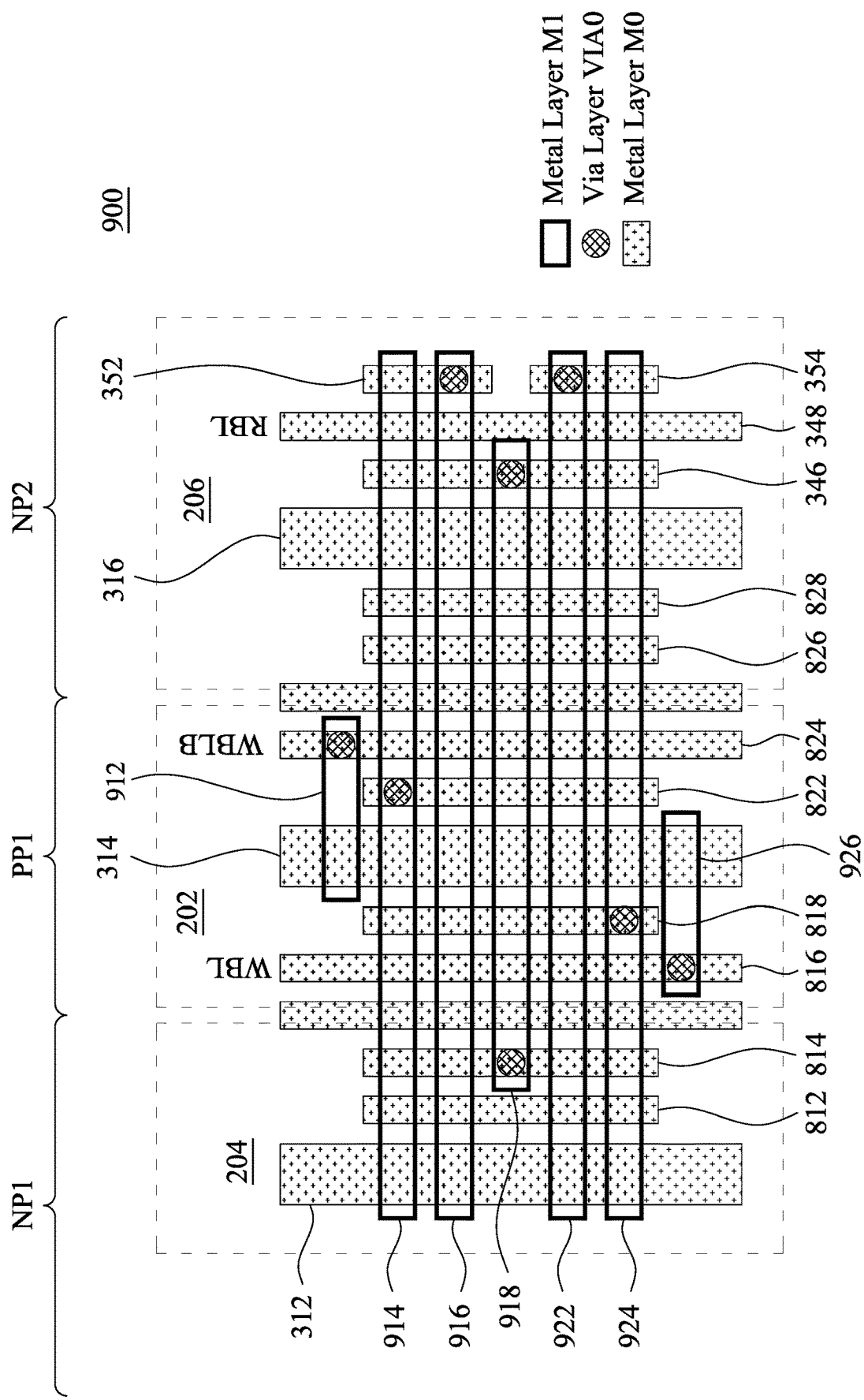

FIG. 9 is a layout diagram 900 of a portion of a memory circuit in accordance with some embodiments, which illustrates middle layers and upper layers (e.g., the second metal layer M1, and the via layer VIA0 between metal layers M0 and M1) of the layout. The memory cells in FIG. 9 are based on memory cells 610A and 610B in FIG. 6, and based on the layers illustrated in layout diagrams 700, 800 of FIG. 7 and FIG. 8. The components in FIG. 9 that are the same or similar to those depicted in FIGS. 2-5 are given the same reference labels, and the detailed description thereof is omitted.

As shown in FIG. 9, the second metal layer M1 may include metal line features 912-926 being perpendicular to metal line features in the first metal layer M0.

The metal line feature 912 corresponds to the write bit line WBL. Through a corresponding via structure, metal line feature 824 in the first metal layer M0 is connected to the metal line feature 912.

The metal line feature 914 corresponds to the write word line WWL[1]. Through a corresponding via structure, metal line feature 822 in the first metal layer M0 is connected to the metal line feature 914.

The metal line feature 916 corresponds to the read word lines RWL[1]. The configuration of the metal line feature 916 is similar to metal line feature 416 in FIG. 4, and thus the detailed description thereof is omitted.

The metal line feature 918 corresponds to the data node MB. Through corresponding via structures, metal line features 814 and 346 in the first metal layer M0 are connected to the metal line feature 918.

The metal line feature 922 corresponds to the read word lines RWL[0]. The configuration of the metal line feature 922 is similar to metal line feature 422 in FIG. 4, and thus the detailed description thereof is omitted.

The metal line feature 924 corresponds to the write word line WWL[0]. Through a corresponding via structure, metal line feature 818 in the first metal layer M0 is connected to the metal line feature 924.

The metal line feature 926 corresponds to the write bit line WBLB. Through corresponding via structures, the metal line feature 816 in the first metal layer M0 are connected to the metal line feature 926.

Figure 10A:
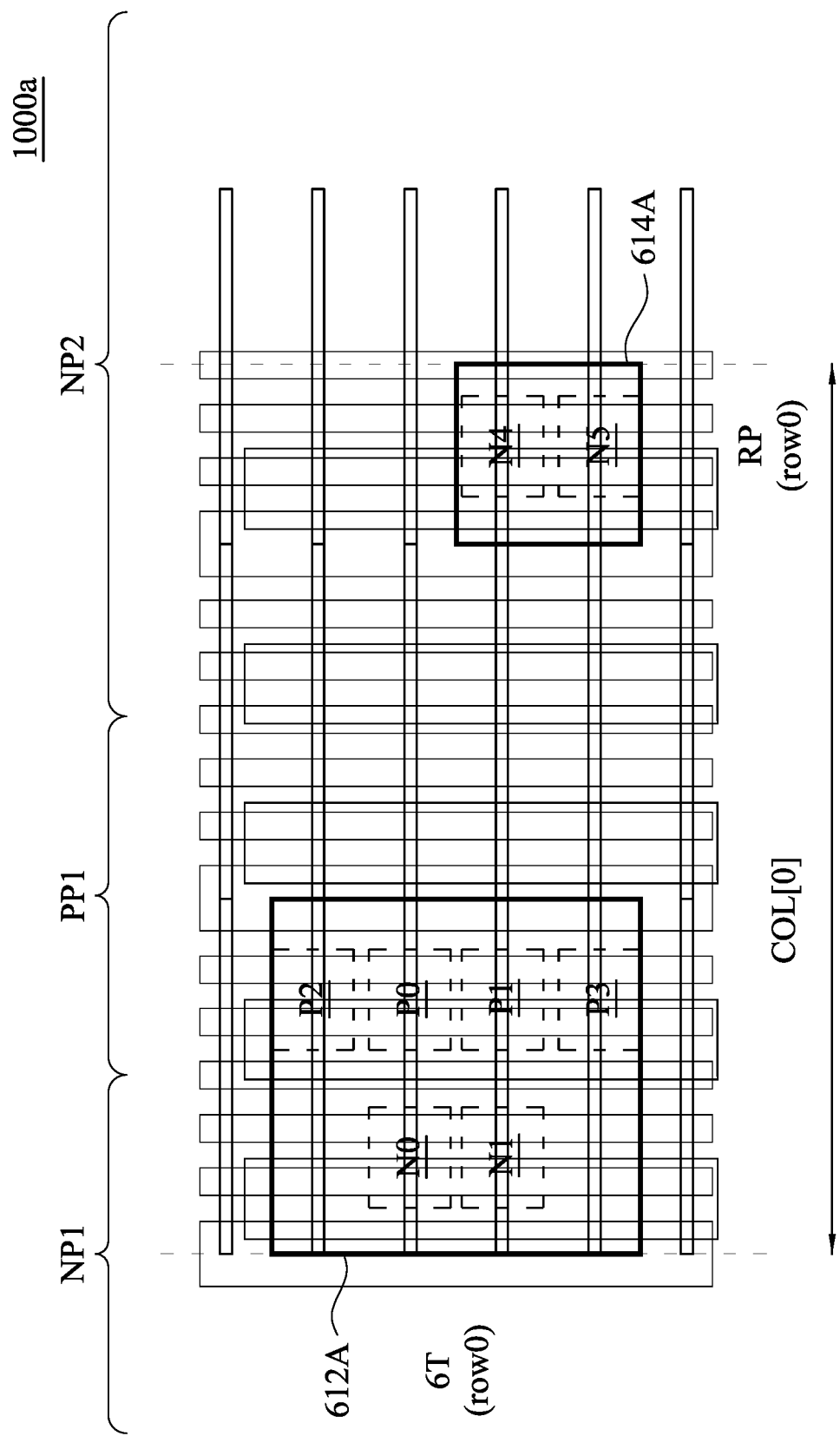

FIG. 10A is a layout diagram 1000a of a portion of a memory circuit in accordance with some embodiments, which illustrates arrangements of transistors N0, N1, and P0-P3 within the 6T part 612A and transistors N4 and N5 within the read port 614A of memory cell 610A of FIG. 6 according to the layout illustrated in FIGS. 7-9. As shown in FIG. 10A, transistors P2, P3 forming the write port in the 6T part 612A are formed in the PP region PP1. Read port 614A is arranged in NP region NP2. Transistors P2, P3 and transistors N4 and N5 within the read port 614A are spaced apart. In addition, the 6T part 612A overlaps the doping regions NP1 and PP1. Similar to the 6T part 112A in FIG. 5A, in the 6T part 612A, n-type transistors N0, N1 are formed in the NP region NP1, and p-type transistors P0, P1 are formed in the PP region PP1.

Figure 10B:
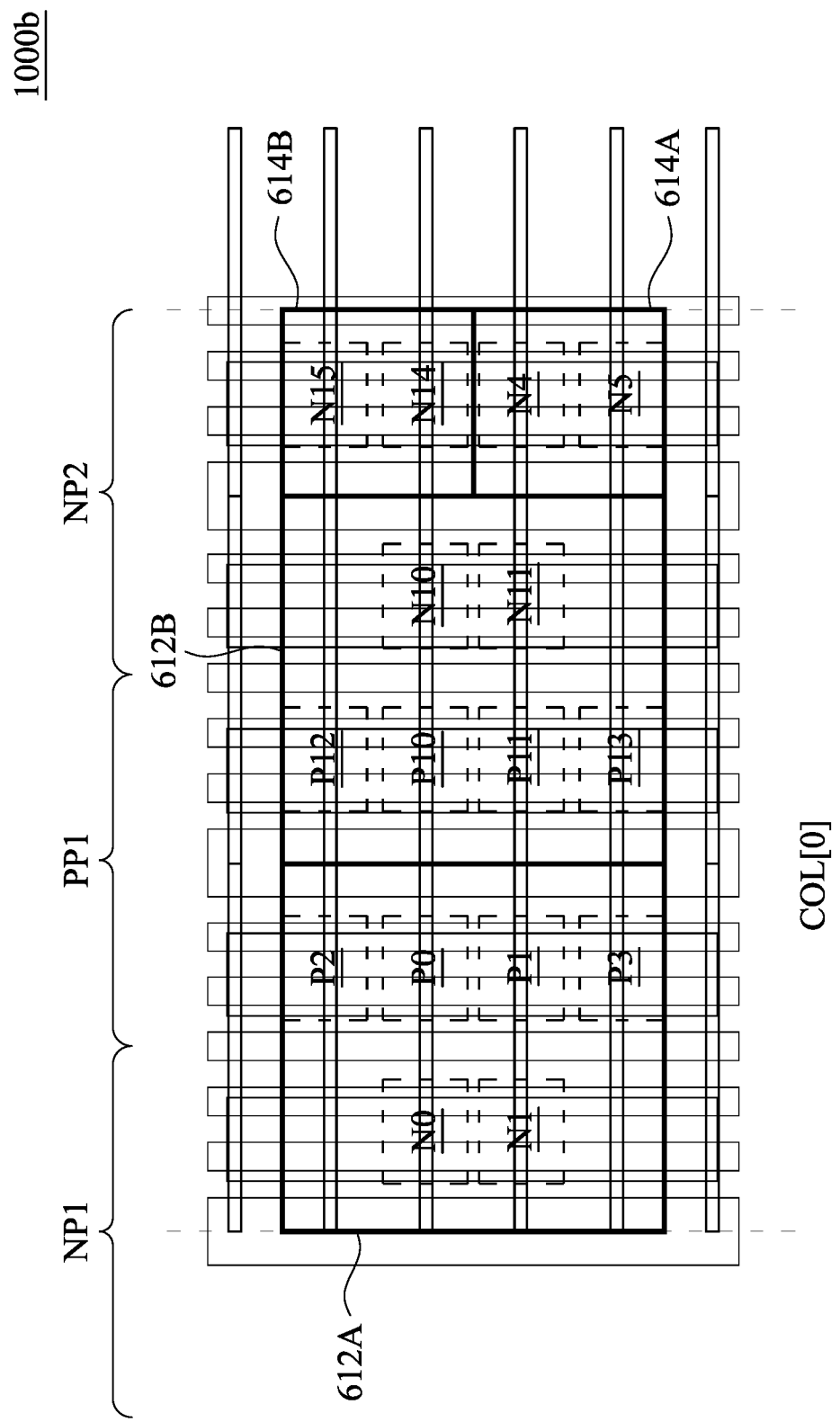

FIG. 10B is a layout diagram 1000b of a portion of a memory circuit in accordance with some embodiments, which illustrates arrangements of transistors within the memory cells 610A and 610B of FIG. 6 according to the layout illustrated in FIGS. 7-9. As shown in FIG. 10B, the read port 614A is separated from the write port and the 6T part 612A by the 6T part 612B (including the write port) of the memory cell 610B, which is the memory cell in the adjacent row and the same column of memory cell 610A.

The 6T part 612B overlaps the doping regions NP2 and PP1. In the 6T part 612B, n-type transistors N10, N11 are formed in the NP region NP2, and p-type transistors P10, P11 are formed in the PP region PP1. As shown in FIG. 10B, transistors P12, P13 forming the write port in the 6T part 612B are formed and in the PP region PP1. Transistors N14, N15 within the read port 614B are formed in the NP region NP2. Similar to the embodiments of FIG. 5B, in the layout diagram 1000b, the first read port (e.g., the read port 614A) associated with the memory cell 610A is separated from the first write port (e.g., the transistors P2 and P3), which is in the 6T part 612A, by the second write port (e.g., the transistors P12 and P13), which is in the 6T part 612B, of the memory cell 610B.

Figure 11:
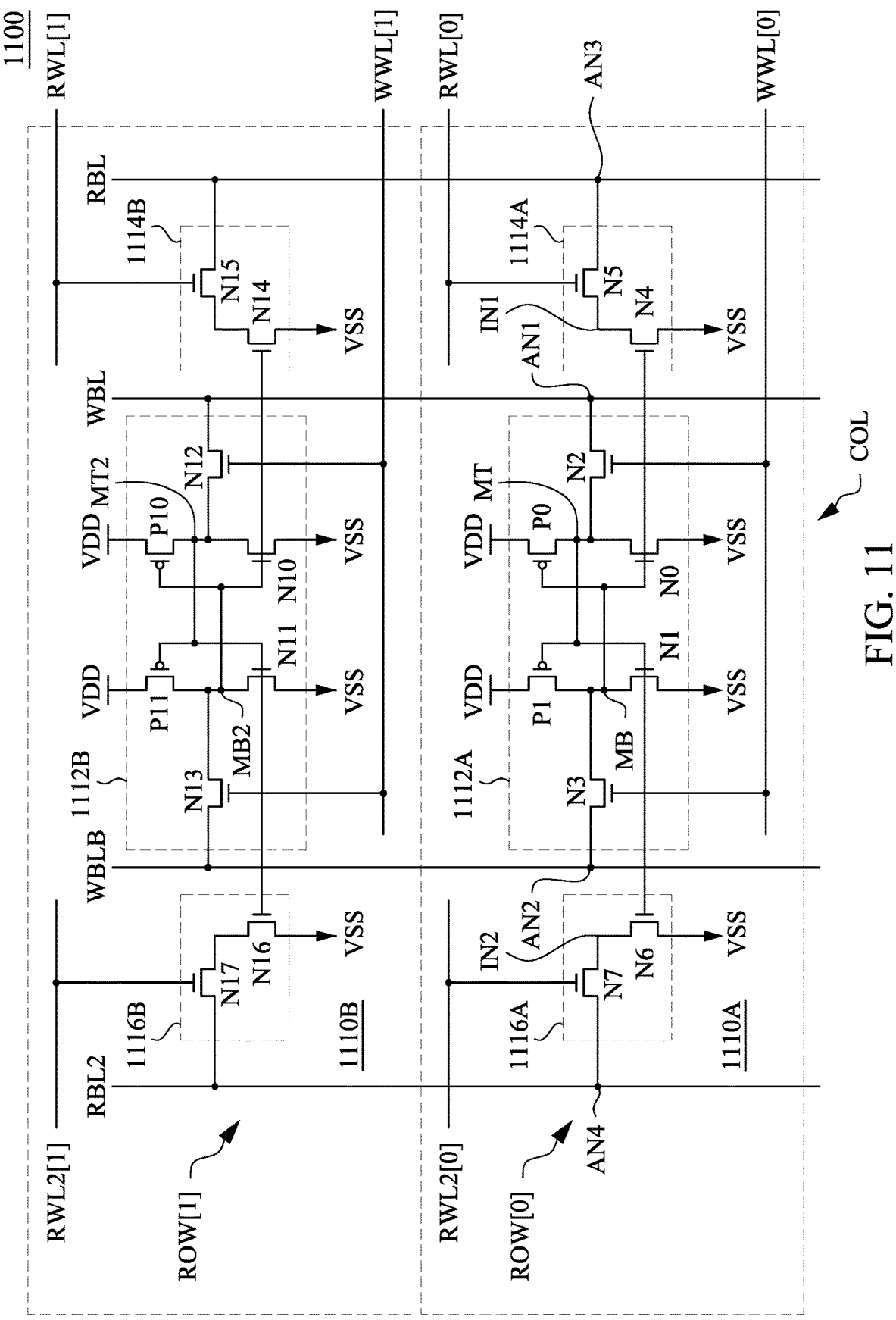
FIG. 11 is a circuit diagram of a portion of a memory circuit in accordance with some embodiments of the present disclosure.

FIG. 11 is a circuit diagram of a portion of a memory circuit 1100 in accordance with some other embodiments. Similar to FIG. 1D, the memory circuit 1100 also includes memory cells arranged into columns and one or more pairs of adjacent rows. For example, the memory circuit 1100 includes memory cells 1110A, and 1110B, which belong to a column COL. Also, memory cell 1110A belongs to a first row ROW[0], and memory cell 1110B belongs to a second row ROW[1].

Compared with 2P-8T SRAM cells (e.g., memory cells 110A and 110B) illustrated in FIG. 1D, memory cells 1110A and 1110B are three-port-ten-transistor (3P-10T) SRAM cells. A three-port memory cell includes a 6T part (e.g., 1112A and 1112B) having a write port, and two read ports (e.g., 1114A and 1116A, 1114B and 1116B) and can be used in a three-port operation or a two-port operation. In a three-port operation, two read ports 1114A and 1116A for the memory cell 1110A are independent. For example, as shown in FIG. 11, the first read port 1114A of memory cell 1110A is coupled to a first read word line RWL[0] and the second read port 1116A of memory cell 1110A is coupled to a second read word line RWL2[0]. The read port operations of read ports 1114A and 1116A may include single-ended reads while maintaining the value of the cell. In two-port operation, read ports 1114A and 1116A are connected, for example, by a single read word line (not shown). The two-port read port operation can include a voltage differential sense amplifier scheme.

In the embodiments shown in FIG. 11, a memory cell 1110A, illustrated as a representative memory cell, includes two P-type transistors P0 and P1 and two N-type transistors N0 and N1 forming a storage unit, another two N-type transistors N2 and N3 as a part of the write port of memory cell 1110A, another two N-type transistors N4 and N5 as a part of a first read port of memory cell 1110A, another two N-type transistors N6 and N7 as a part of a second read port of memory cell 1110A. Similarly, a memory cell 1110B, illustrated as another representative memory cell, includes two P-type transistors P10 and P11 and two N-type transistors N10 and N11 forming a storage unit, another two N-type transistors N12 and N13 as a part of the write port of memory cell 1110B, another two N-type transistors N14 and N15 as a part of a first read port of memory cell 1110B, and another two N-type transistors N16 and N17 as a part of a second read port of memory cell 1110B.

Compared with memory circuit 100 in FIG. 1D, memory cells 1110A, 1110B each further includes a second read port including two N-type transistors (e.g., transistors N6 and N7 forming the read port 116A for memory cell 1110A, and transistors N16 and N17 forming the read port 116B for memory cell 1110B).

For example, transistor N6 has a source coupled to power supply node VSS, a gate coupled to data node MT, and a drain coupled to transistor N7. Transistor N6 is configured to be turned off when the gate of transistor N6 has a voltage level corresponding to the logical low value, and to be turned on when the gate of transistor N6 has a voltage level corresponding to the logical high value. Transistor N6 also functions as a pulling device configured to selectively couple the intermediate node IN2 to the power supply node VSS responsive to the voltage level at data node MT.

Transistor N7 is coupled with read bit line RBL2 at an access node AN4 and with the drain of transistor N6. Read word line RWL2[0] is coupled with a gate of transistor N7. Transistor N7 functions as a read pass gate controlled by read word line RWL2[0].

Memory cell 1110B has configurations similar to that of memory cell 1110A. For example, transistor N16 has a source coupled to power supply node VSS, a gate coupled to data node MT2, and a drain coupled to transistor N17.

Transistor N16 is configured to be turned off when the gate of transistor N16 has a voltage level corresponding to the logical low value, and to be turned on when the gate of transistor N16 has a voltage level corresponding to the logical high value. Transistor N16 also functions as a pulling device configured to selectively couple the intermediate node to the power supply node VSS responsive to the voltage level at data node MT2.

Transistor N17 is coupled with read bit line RBL2 at the corresponding access node and with the drain of transistor N16. Read word line RWL2[0] is coupled with a gate of transistor N17. Transistor N17 functions as a read pass gate controlled by read word line RWL2[1].

For memory cells 1110A and 1110B in FIG. 11, each read port 114A, 114B and 116A, 116B has a separate control line (RWL[0], RWL[1], RWL2[0], RWL2[1]). The read operations may be performed independently or simultaneously. The use of the two read ports provides additional flexibility and allows two outputs to be read from the cell simultaneously.

Figure 12:
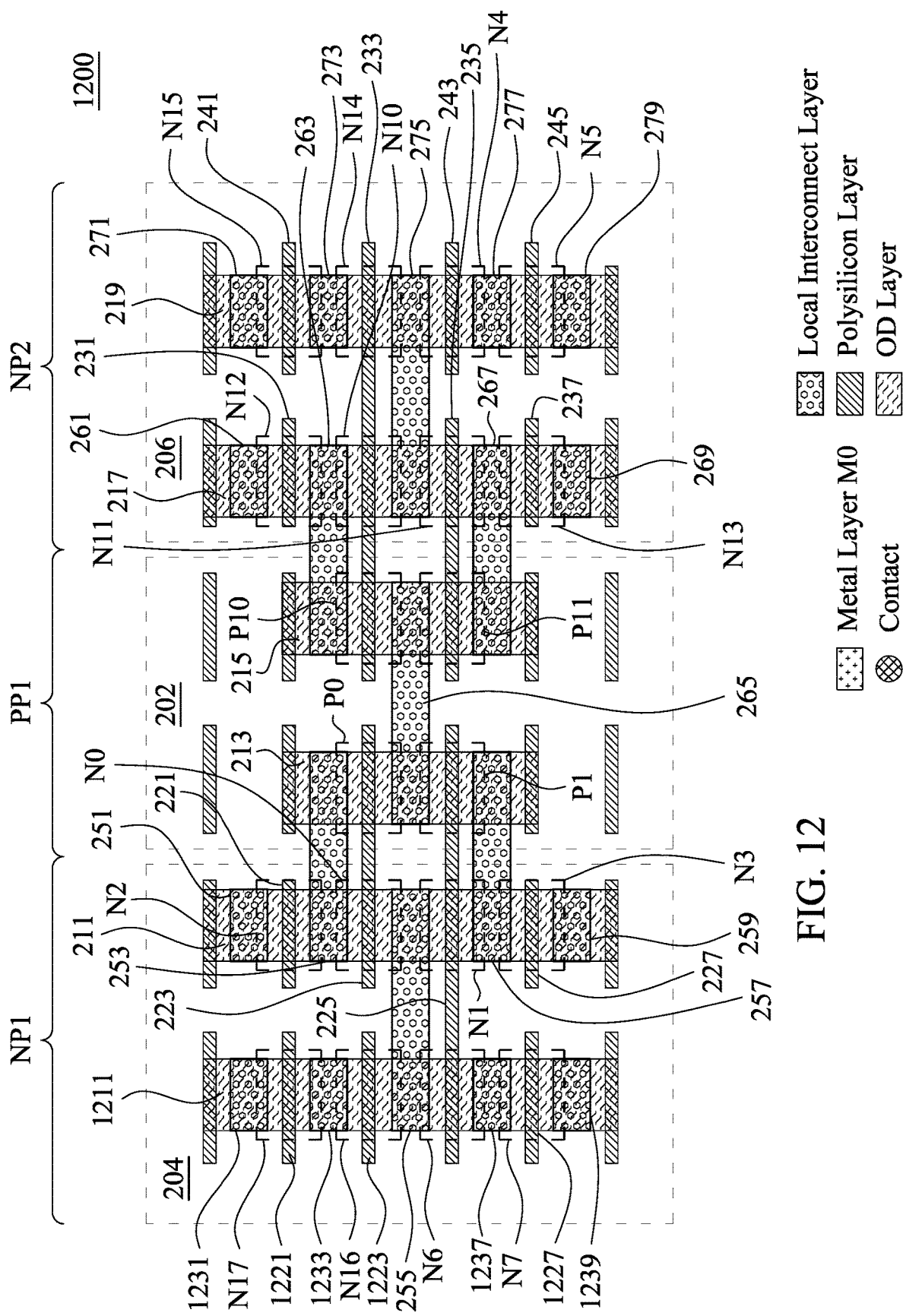
FIGS. 12-15 are layout diagrams of a portion of a memory circuit in accordance with some embodiments of the present disclosure.

FIG. 12 is a layout diagram 1200 of a portion of a memory circuit in accordance with some embodiments, which illustrates lower layers (e.g., oxide-definition regions, gate layers, and interconnection layers) of the layout. The memory cells in FIG. 12 are based on memory cells 1110A and 1110B in FIG. 11 and are usable to illustrate layout designs of other memory cells in the memory circuit 1100 of FIG. 11. The components in FIG. 12 that are the same or similar to those depicted in FIGS. 2-5 are given the same reference labels, and the detailed description thereof is omitted.

Compared to the layout diagram 200 in FIG. 2, layout diagram 1200 further includes an oxide-definition (OD) region 1211 indicating N-type implantation regions buried in P-well region 204, polysilicon regions 1221, 1223, and 1227, interconnection regions 1231, 1233, 1237, and 1239. In some embodiments, interconnection regions 251-279 and 1231-1239 correspond to conductive structures of a common layer. A person having ordinary skill in the art would appreciate that one or more of the layout patterns described herein is usable to prepare a set of masks, that are in turn usable for manufacturing a memory cell in an integrated circuit.

As shown in FIG. 12, NMOS transistors N0, N1, N2, and N3 defined in the first N-type implantation region (e.g., area NP1) are similar to those in FIG. 2, and thus the detailed description thereof is omitted.

In addition, transistors corresponding to NMOS transistors N6, N7, N16, and N17 in the second read ports RP2a, RP2b for both memory cells 1110A and 1110B in FIG. 11 are also defined in the first N-type implantation region (e.g., area NP1).

Interconnection structure 255, polysilicon region 225, OD region 1211, and interconnection structure 1237 define NMOS transistor N6 (as shown in FIG. 11). Polysilicon region 225 further corresponds to the gate of NMOS transistor N6 and connects the gates of the transistors N1, N6 and P1.

Interconnection structure 1237, polysilicon region 1227, OD region 1211, and interconnection structure 1239 define NMOS transistor N7 (as shown in FIG. 11). Polysilicon region 1227 corresponds to the gate of NMOS transistor N7, interconnection structure 1239 corresponds to a node to be connected with the read bit line RBL2. The NMOS transistors N6 and N7 are connected by interconnection structure 1237.

Interconnection structure 1233, polysilicon region 1223, OD region 1211, and interconnection structure 255 define NMOS transistor N16 (as shown in FIG. 11). Polysilicon region 1223 corresponds to the gate of NMOS transistor N16.

Interconnection structure 1231, polysilicon region 1221, OD region 1211, and interconnection structure 1233 define NMOS transistor N17 (as shown in FIG. 11). Polysilicon region 1221 corresponds to the gate of NMOS transistor N17. Interconnection structure 1231 corresponds to a node to be connected with the read bit line RBL2. The NMOS transistors N16 and N17 are connected by interconnection structure 1233.

PMOS transistors P0, P1, P10 and P11 defined in the P-type implantation region (e.g., area PP1) are similar to those in FIG. 2, and thus the detailed description thereof is omitted. NMOS transistors N10, N11, N12, N13, and NMOS transistors N4, N5, N14, and N15 (in the first read ports for memory cells 1110A, 1110B) defined in the second N-type implantation region (e.g., area NP2) are similar to those in FIG. 2, and thus the detailed description thereof is omitted.

Figure 13:
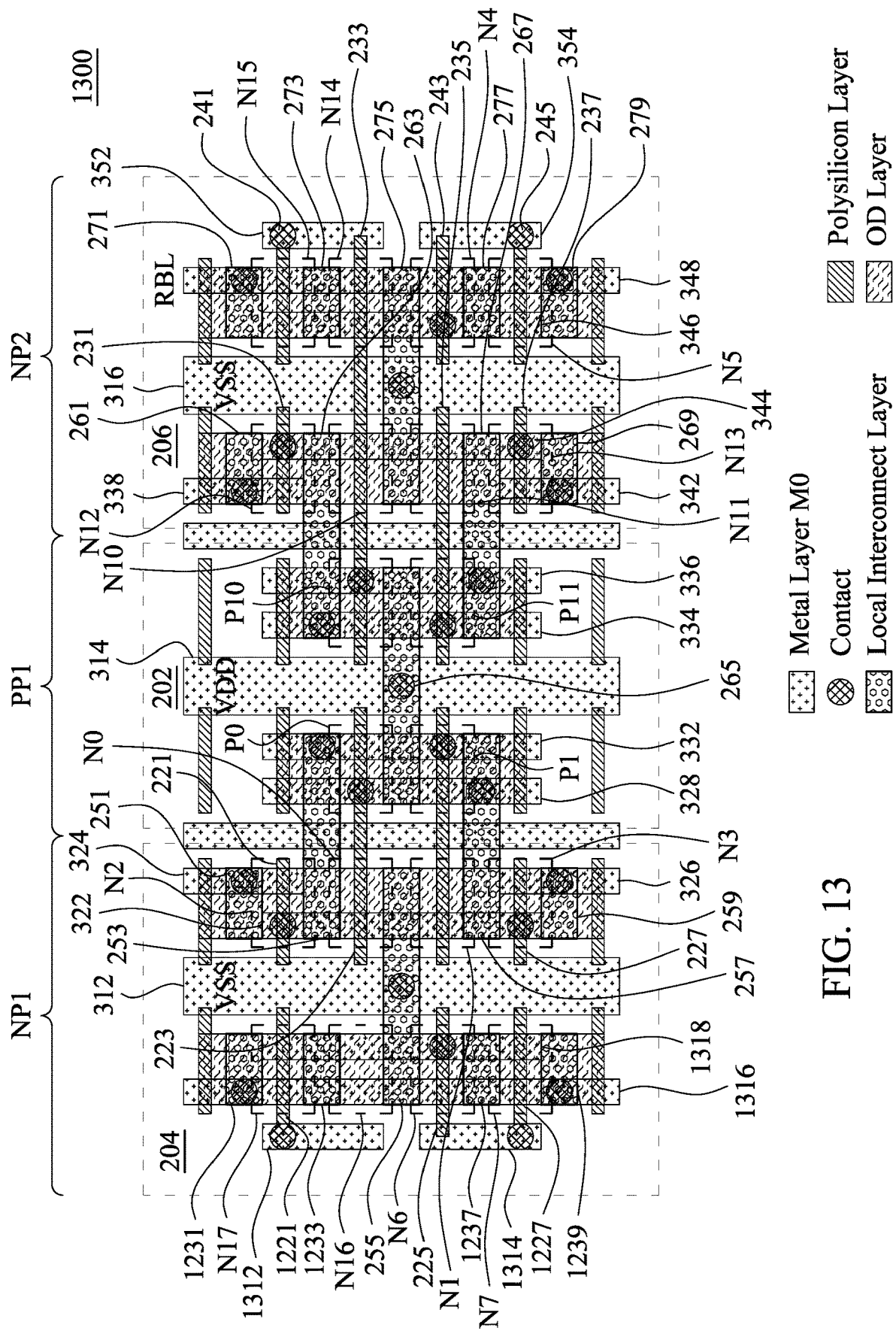

FIG. 13 is a layout diagram 1300 of a portion of a memory circuit in accordance with some embodiments, which illustrates lower layers and middle layers (e.g., the contacts and the first metal layer M0) of the layout. The memory cells in FIG. 13 are based on memory cells 1110A and 1110B in FIG. 11, and based on the lower layers illustrated in layout diagram 1200 of FIG. 12.

As shown in FIG. 13, the power rails 312, 314, and 316, and metal line features 322-354 are similar to those in FIG. 3, and thus the detailed description thereof is omitted.

In addition, the first metal layer M0 further includes metal line features 1312, 1314, 1316, and 1318. The metal line features 1312, 1314 separately correspond to nodes to be respectively connected with the read word lines RWL2[1] and RWL2[0] for memory cells 110B and 110A. Contacts extend downwardly from the metal line features 1312, 1314 to respectively couple the gate regions of transistors N17 and N7 to the metal line features 1312, 1314.

The metal line feature 1316 corresponds to the read bit line RBL2. Contacts separately extend downwardly from the metal line feature 1316 to couple the corresponding source/drain regions of transistors N7 and N17 together.

The metal line feature 1318 corresponds to a node to be connected with the data node MT2. A contact extends downwardly from the metal line feature 1318 to couple the gate region of the transistor N16 to the metal line feature 1318.

Figure 14:
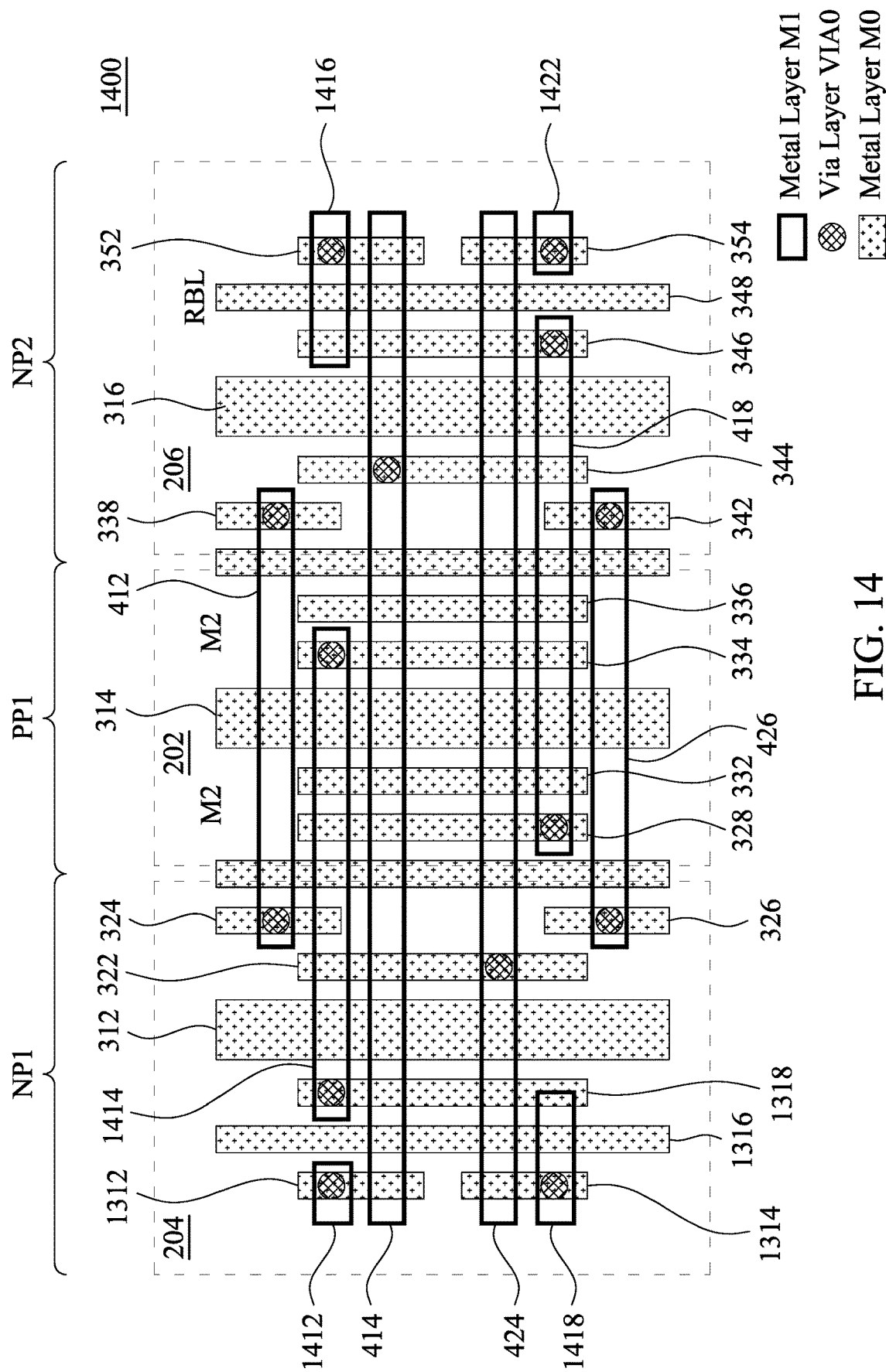

FIG. 14 is a layout diagram 1400 of a portion of a memory circuit in accordance with some embodiments, which illustrates middle layers and upper layers (e.g., the second metal layer M1, and the via layer VIA0 between metal layers M0 and M1) of the layout. The memory cells in FIG. 14 are based on memory cells 1110A and 1110B in FIG. 11, and based on the layers illustrated in layout diagrams 1200, 1300 of FIG. 12 and FIG. 13.

As shown in FIG. 14, metal line features 412, 414, 418, 424, and 426 in the second metal layer M1 are similar to those in FIG. 4, and thus the detailed description thereof is omitted. The second metal layer M1 further includes metal line features 1412, 1414, 1416, 1418, and 1422 being perpendicular to metal line features in the first metal layer M0.

The metal line feature 1412, which corresponds to the read word line RWL2[1], is connected to the metal line feature 1312 in the first metal layer M0 through a corresponding via structure.

The metal line feature 1414, which corresponds to the data node MT2, is connected to the metal line features 1318 and 334 in the first metal layer M0 through corresponding via structures.

The metal line feature 1416, which corresponds to the read word line RWL[1], is connected to the metal line feature 352 in the first metal layer M0 through a corresponding via structure.

The metal line feature 1418, which corresponds to the read word line RWL2[0], is connected to the metal line feature 1314 in the first metal layer M0 through a corresponding via structure.

The metal line feature 1422, which corresponds to the read word line RWL[0], is connected to the metal line feature 354 in the first metal layer M0 through a corresponding via structure.

Figure 15:
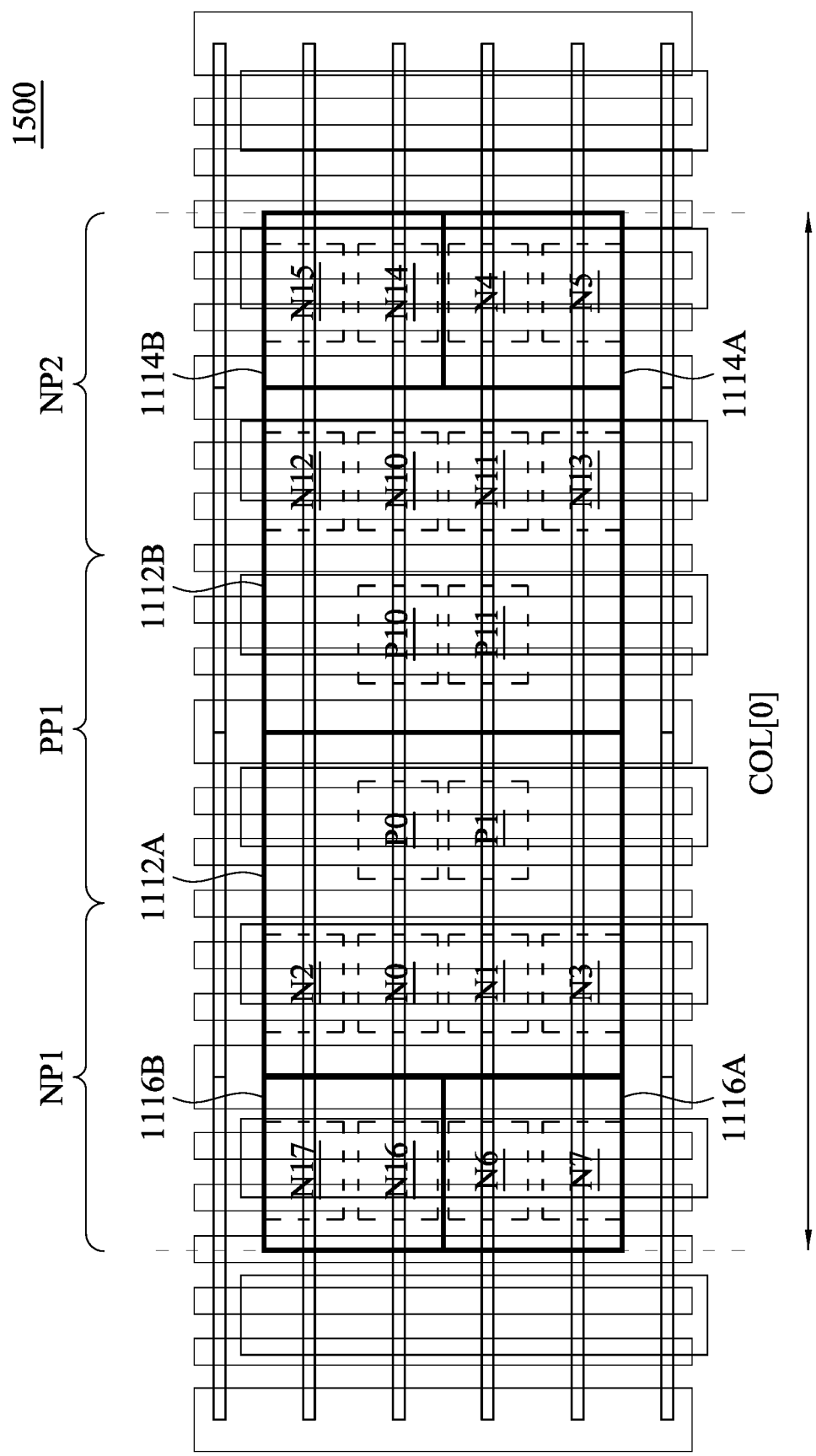

FIG. 15 is a layout diagram 1500 of a portion of a memory circuit in accordance with some embodiments, which illustrates arrangements of transistors within the memory cells 1110A and 1110B of FIG. 11 according to the layout illustrated in FIGS. 12-14.

As shown in FIG. 15, 6T parts 1112A, 1112B, and read ports 1114A, 1114B of memory cells 1110A and 1110B are similar to those 6T parts 112A, 112B, and read ports 114A, 114B in FIG. 5B, and thus the detailed description thereof is omitted. Compared to the layout diagram 500b of FIG. 5B, the layout diagram 1500 further includes the second read ports 1116A, 1116B of memory cells 1110A and 1110B.

As shown in FIG. 15, transistors N6, N7 within the read port 1116A, and transistors N16 and N17 within the read port 1116B are formed in the NP region NP1. Alternatively stated, n-type transistors N6, N7 forming the read port 1116A and n-type transistors N0, N1, N2 and N3 within the 6T part 1112A are formed in the same doping region NP1. N-type transistors N16, N17 forming the read port 1116B are separated from the 6T part 1112B by the 6T part 1112A (including the write port) of the memory cell 1110A, which is the memory cell in the adjacent row and the same column of memory cell 1110B.

Figure 16:
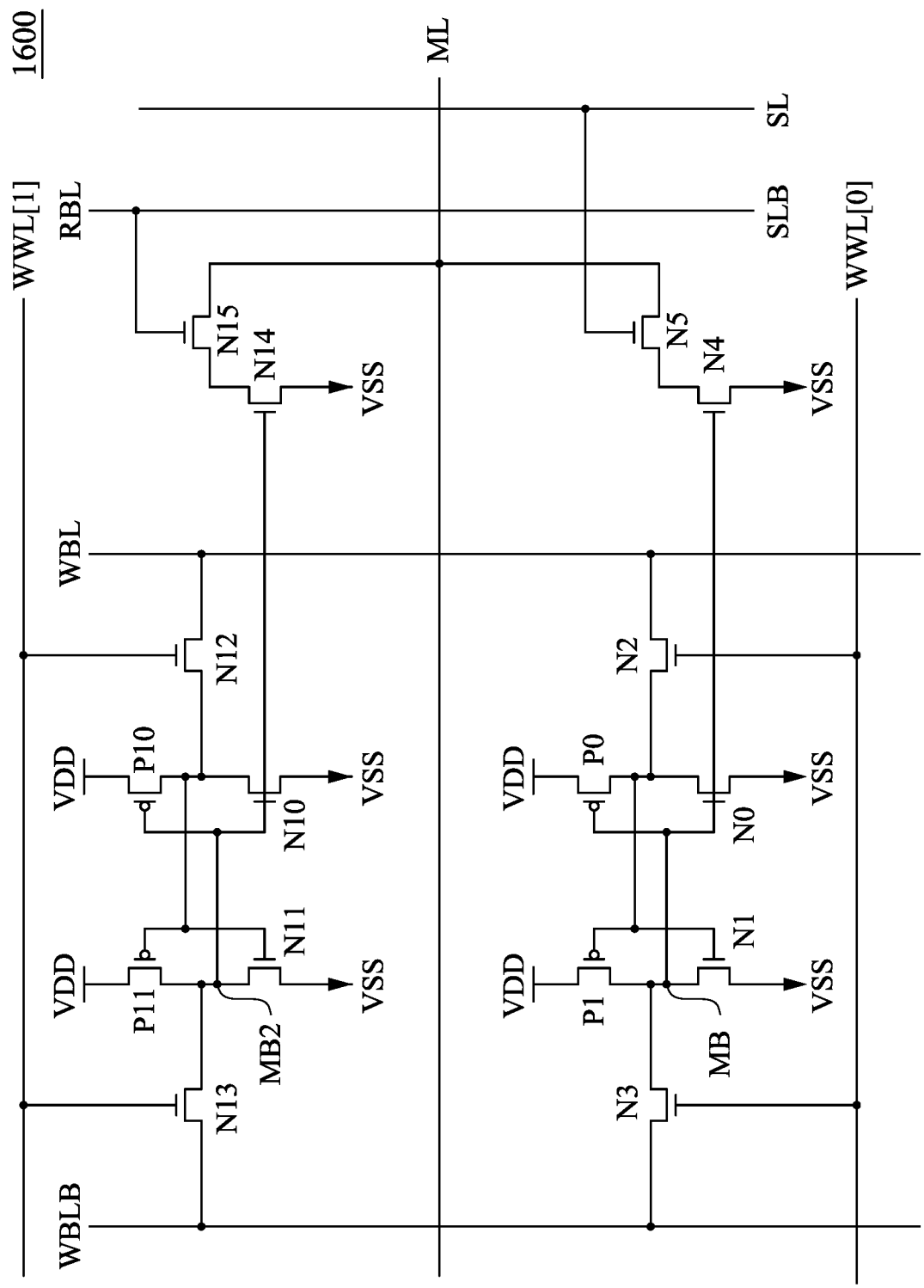
FIG. 16 is a circuit diagram of a portion of a memory circuit in accordance with some embodiments of the present disclosure.

FIG. 16 is a circuit diagram of a portion of a memory circuit 1600 in accordance with some embodiments. As shown in FIG. 16, transistors N0-N5, N10-N15, P0, P1, P10, and P11 can also be used to achieve a 16T Ternary Content Addressable Memory (TCAM) memory cell. In the memory circuit 1600, transistors N4 and N14 function as the data gate transistors, and transistors N5 and N15 function as the search gate transistors. As shown in FIG. 16, gates of the transistors N4 and N14 are respectively connected to data nodes MB and MB2. In some embodiments, the transistors N5 and N15 are connected together to a match line ML. The gate of transistor N5 is connected to a search line SL, and the gate of transistor N15 is connected to a complementary search line SLB.

As shown above, the layout design discussed above in FIG. 1D-FIG. 5 for 8T2P memory cells can also be applied to TCAM cells by modifying the connections within the metal layers and vias. Alternatively stated, transistors N0, N1, N2, N3 in a first SRAM cell of the TCAM memory cell are arranged in the first NP region, while transistors N4, N5, N14, and N15 forming a comparison circuit of the TCAM memory cell is arranged in a second NP region separated from the first NP region. In some embodiments, transistors N10, N11, N12, N13 in a second SRAM cell of the TCAM memory cell are also arranged in the second NP region. Transistors P0, P1, P10, and P11 are arranged in the first PP region between the first and the second NP regions.

Figure 17:
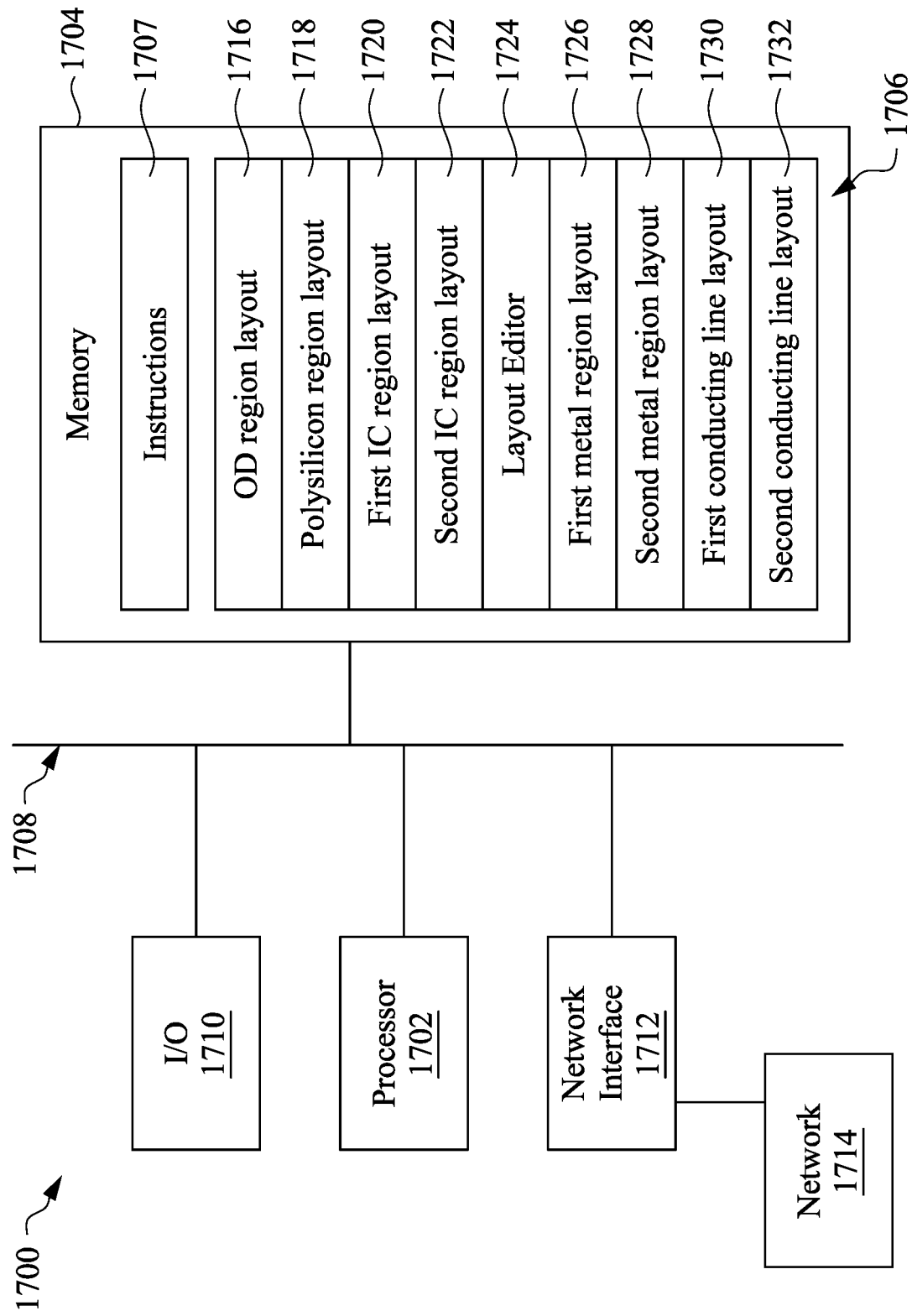
FIG. 17 is a block diagram of an integrated circuit designing system for designing a semiconductor device in accordance with some embodiments of the present disclosure.

FIG. 17 is a block diagram of an integrated circuit designing system 1700 for designing a semiconductor device in accordance with some embodiments of the present disclosure. In some embodiments, the system 1700 is a general-purpose computing device which implements a method 1800 of FIG. 18 in accordance with one or more embodiments. Control system 1700 includes a hardware processor 1702 and a non-transitory, computer readable storage medium 1704 encoded with, i.e., storing, the computer program code 1706, i.e., a set of executable instructions. Computer readable storage medium 1704 is also encoded with instructions 1707 for interfacing with manufacturing machines for producing the semiconductor device. The processor 1702 is electrically coupled to the computer readable storage medium 1704 via a bus 1708. The processor 1702 is also electrically coupled to an I/O interface 1710 by bus 1708. A network interface 1712 is also electrically connected to the processor 1702 via bus 1708. Network interface 1712 is connected to a network 1714, so that processor 1702 and computer readable storage medium 1704 are capable of connecting to external elements via network 1714. The processor 1702 is configured to execute the computer program code 1706 encoded in the computer readable storage medium 1704 in order to cause system 1700 to be usable for performing a portion or all of the operations as described in method 1800.

In one or more embodiments, the processor 1702 is a central processing unit (CPU), a multi-processor, a distributed processing system, an application specific integrated circuit (ASIC), and/or a suitable processing unit.

In one or more embodiments, the computer readable storage medium 1704 is an electronic, magnetic, optical, electromagnetic, infrared, and/or a semiconductor system (or apparatus or device). For example, the computer readable storage medium 1704 includes a semiconductor or solid-state memory, a magnetic tape, a removable computer diskette, a random-access memory (RAM), a read-only memory (ROM), a rigid magnetic disk, and/or an optical disk. In one or more embodiments using optical disks, the computer readable storage medium 1704 includes a compact disk-read only memory (CD-ROM), a compact disk-read/write (CD-R/W), and/or a digital video disc (DVD).

In one or more embodiments, the storage medium 1704 stores the computer program code 1706 configured to cause system 1700 to perform method 1800. In one or more embodiments, the storage medium 1704 also stores information needed for performing method 1800 as well as information generated during performing method 1800, such as OD region layout 1716, polysilicon structure layout 1718, first interconnecting (IC) region layout 1720, second IC region layout 1722, layout editor 1724, first metal structure layout 1726, second metal structure layout 1728, first conducting line layout 1730, second conducting line layout 1732, and/or a set of executable instructions to perform the operation of method 1800.

In one or more embodiments, the storage medium 1704 stores instructions 1707 for interfacing with external machines. The instructions 1707 enable processor 1702 to generate instructions readable by the external machines to effectively implement method 1800 during a design process. In some embodiments, the design process is of a semiconductor device including one or more circuit elements.

Control system 1700 includes I/O interface 1710. I/O interface 1710 is coupled to external circuitry. In one or more embodiments, I/O interface 1710 includes a keyboard, keypad, mouse, trackball, trackpad, touchscreen, and/or cursor direction keys for communicating information and commands to processor 1702.

Control system 1700 also includes network interface 1712 coupled to the processor 1702. Network interface 1712 allows system 1700 to communicate with network 1714, to which one or more other computer systems are connected. Network interface 1712 includes wireless network interfaces such as BLUETOOTH, WIFI, WIMAX, GPRS, or WCDMA; or wired network interfaces such as ETHERNET, USB, or IEEE-1394. In one or more embodiments, method 1800 is implemented in two or more systems 1700, and information such as OD region layout 1716, polysilicon structure layout 1718, first interconnecting (IC) region layout 1720, second IC region layout 1722, layout editor 1724, first metal structure layout 1726, second metal structure layout 1728, first conducting line layout 1730, second conducting line layout 1732 are exchanged between different systems 1700 via network 1714.

Control system 1700 is configured to receive information related to a UI through I/O interface 1710. The information is transferred to processor 1702 via bus 1708 to generate OD region layout. The information is then stored in computer readable medium 1704 as OD region layout 1716. Control system 1700 is configured to receive information related to a polysilicon structure layout through I/O interface 1710. The information is stored in computer readable medium 1704 as polysilicon structure layout 1718. Control system 1700 is configured to receive information related to a first IC region layout through I/O interface 1710. The information is stored in computer readable medium 1704 as first IC region layout 1720. Control system 1700 is configured to receive information related to a second IC region layout through I/O interface 1710. The information is stored in computer readable medium 1704 as second IC region layout 1722. Control system 1700 is configured to receive information related to a layout editor through I/O interface 1710. The information is stored in computer readable medium 1704 as layout editor 1724. Control system 1700 is configured to receive information related to a first metal structure layout through I/O interface 1710. The information is stored in computer readable medium 1704 as first metal structure layout 1726. Control system 1700 is configured to receive information related to a second metal structure layout through I/O interface 1710. The information is stored in computer readable medium 1704 as second metal structure layout 1728. Control system 1700 is configured to receive information related to a first conducting line layout through I/O interface 1710. The information is stored in computer readable medium 1704 as first conducting line layout 1730. Control system 1700 is configured to receive information related to a second conducting line layout through I/O interface 1710. The information is stored in computer readable medium 1704 as second conducting line layout 1732.

Figure 18:
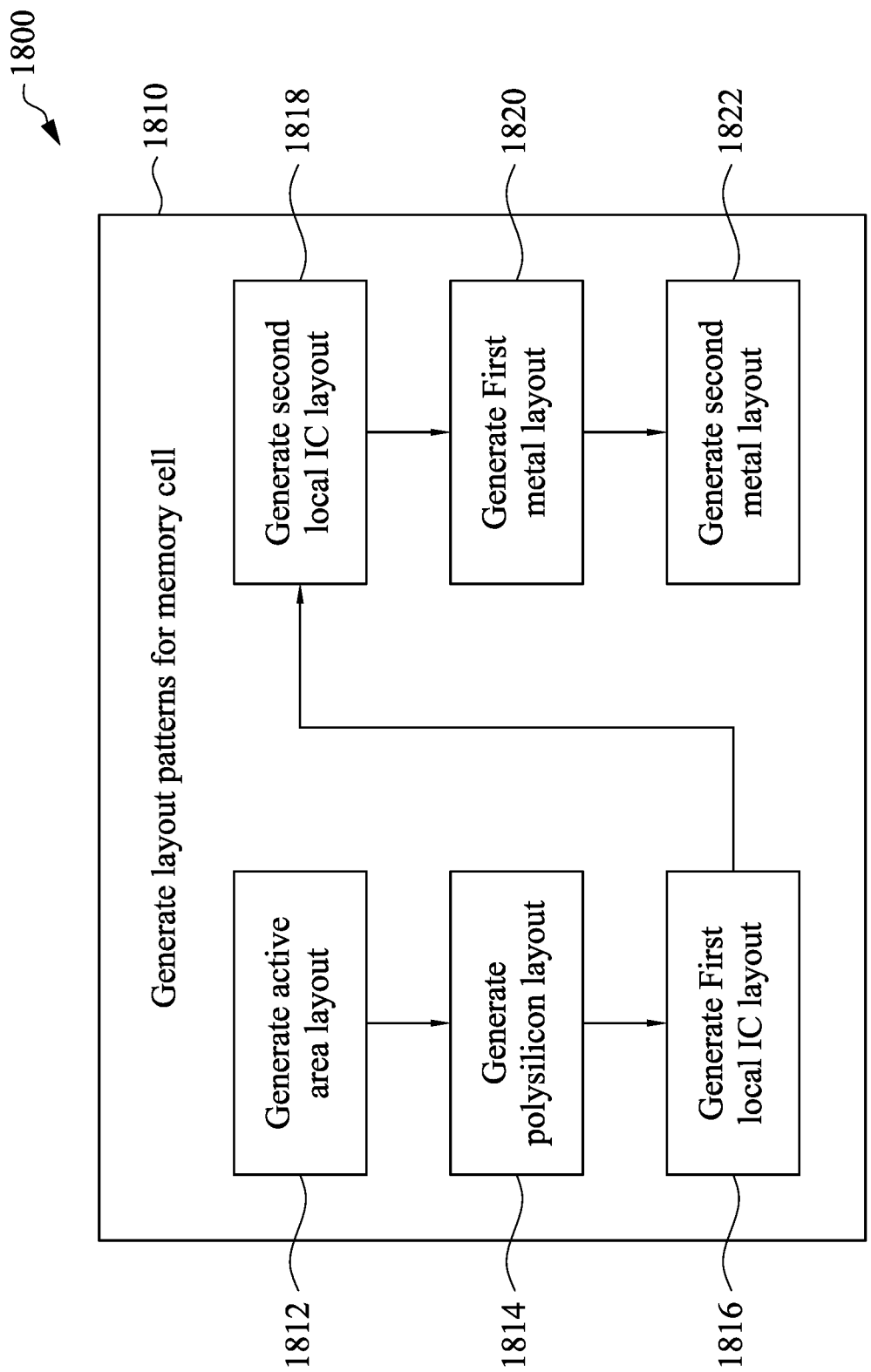
FIG. 18 is a flowchart of a method of generating a layout design in accordance with some embodiments of the present disclosure.

FIG. 18 is a flowchart of a method 1800 of generating a layout design in accordance with some embodiments of the present disclosure. It is understood that additional operations may be performed before, during, and/or after the method 1800 depicted in FIG. 18, and that some other processes may only be briefly described herein. In some embodiments, the method 1800 is performed by operating a hardware computer (such as computer system 1700 in FIG. 17).

In operation 1810, layout patterns of a memory cell, such as layout patterns depicted in FIGS. 2-4, 7-9, and 12-14, are generated. The generated layout patterns include one or more layout patterns for forming SRAM memory cell structures. In some embodiments, the one or more layout patterns for forming SRAM memory cell structures overlap at least one, and not necessarily both, of corresponding active layout pattern and the corresponding isolation region of the memory cell.

For example, in operation 1812, an active area layout pattern associated with forming an active area of the memory cell is generated. An isolation region is located outside of at least the active area layout pattern. In operation 1814, a polysilicon layout pattern associated with forming a polysilicon structure of the memory cell is generated. The polysilicon layout pattern is configured to overlap the active area layout pattern. In operation 1816, a first interconnection layout pattern associated with forming a first interconnection structure of the memory cell is generated. In some embodiments, the first interconnection layout pattern is configured to overlap the active area layout pattern. In some embodiments, in operation 1818, a second interconnection layout pattern associated with forming a second interconnection structure of the memory cell is generated. The second interconnection layout pattern is configured to overlap the isolation region. In operation 1820, a first metal layout pattern associated with forming a first metal structure of the memory cell is generated. The first metal layout pattern is configured to overlap at least the first polysilicon structure and the first interconnection structure. In operation 1822, a second metal layout pattern associated with forming a second metal structure of the memory cell is generated. The second metal layout pattern is configured to overlap at least the first metal structure.

By the operations described above, a method for forming SRAM memory cell structures can be performed accordingly based on the standard cell rules to provide a SRAM or TCAM memory including memory cells arranged in rows and columns, such as the memory cells illustrated in FIG. 1D, FIG. 6, FIG. 11 or FIG. 16.

Consistent with the embodiments of FIGS. 1D-5D, in some embodiments, the method may include forming first write access transistors N2, N3 for a first memory cell 100A within the OD region 211, forming first read access transistors N4, N5 for the first memory cell 100A within the OD region 219, forming second write transistors N12, N13 for a second memory cell 100B within the OD region 217 between OD regions 211 and 219. In some embodiments, the method further includes forming second read access transistors N14, N15 for the second memory cell 100B within the OD region 219. In some embodiments, transistors N4, N5, N10-N15 are formed in the same n-plus (NP) region NP2 overlapping the OD regions 217, 219, while transistors N0-N3 are formed in another n-plus (NP) region NP1.

Consistent with the embodiments of FIGS. 6-10B, in some embodiments, first write access transistors P2, P3 for the memory cell 600A are formed within the OD region 213. Second write access transistors P12, P13 for the memory cell 600B are formed within the OD region 215. The PP region PP1 overlaps the OD regions 213, 215.

Consistent with the embodiments of FIGS. 11-15, in some embodiments, each of the memory cells 1110A, 1110B includes two read ports, and the method further includes forming third read access transistors N6, N7 for the first memory cell 1110A within the OD region 1211, and forming fourth read access transistors N16, N17 for the second memory cell 1110B within the OD region 1211. In some embodiments, transistors N6, N7, N16, and N17 are formed in the NP region NP1 overlapping the OD regions 211, 1211.

The above illustrations include exemplary operations, but the operations are not necessarily performed in the order shown. Operations may be added, replaced, rearranged, and/or eliminated as appropriate, without departing from the spirit and scope of the present disclosure.

By arranging read access transistors and write access transistors properly and separating read access transistors and write access transistors in different regions for some memory cells, standard cell rules can be satisfied when designing layouts for various SRAM or TCAM memory. Accordingly, the circuit area reduction can be achieved based on the standard-cell-based design with proper routing track assignments.

In some embodiments, an apparatus is disclosed that includes memory cells. A first memory cell of the memory cells includes a first write port laid out in a first doping region and a first read port laid out in a second doping region. The first read port is separated from the first write port by a second write port of a second memory cell of the memory cells.

In some embodiments, a semiconductor device is also disclosed that includes a first memory cell. The first memory cell includes a first storage unit including n-type transistors formed in a first n-plus (NP) region and p-type transistors formed in a first p-plus (PP) region between the first NP region and a second NP region, first write access transistors formed in the first NP region or in the first PP region, and first read access transistors formed in the second NP region.

In some embodiments, a method for forming a SRAM memory cell structure is also disclosed. The method includes forming first write access transistors for a first memory cell within a first area; forming first read access transistors for the first memory cell within a second area; and forming second write transistors for a second memory cell within a third area between the first area and the second area, the first memory cell and the second memory cell being memory cells in adjacent rows of the same column.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a plurality of memory cells including at least a first memory cell and a second memory cell;
a first write port comprising a plurality of first write access transistors formed within a first area and laid out in a first doping region of the first memory cell; and
a first read port comprising a plurality of first read access transistors formed within a second area and laid out in a second doping region of the first memory cell, the first read port being separated from the first write port by a second write port of the second memory cell,
wherein the second write port comprises a plurality of second write access transistors formed within a third area between the first area and the second area.

2. The apparatus of claim 1, wherein the first memory cell and the second memory cell are memory cells in adjacent rows of the same column.

3. The apparatus of claim 1, wherein the second memory cell comprises:
the second write port and a second read port laid out in the second doping region.

4. The apparatus of claim 1, wherein the second memory cell comprises:
the second write port laid out in the first doping region; and
a second read port laid out in the second doping region.

5. The apparatus of claim 1, wherein the first write port comprises n-type transistors, and the first doping region and the second doping region are n-plus (NP) regions.

6. The apparatus of claim 1, wherein the first write port comprises p-type transistors, the first doping region is a p-plus (PP) region, and the second doping region is an NP region.

7. The apparatus of claim 1, wherein the first memory cell further comprises another first read port laid out in the first doping region, and the second memory cell further comprises another second read port laid out in the first doping region.

8. An apparatus, comprising:
a first memory cell and a second memory cell, the first memory cell comprising:
a first storage unit comprising n-type transistors formed in a first n-plus (NP) region and p-type transistors formed in a first p-plus (PP) region between the first NP region and a second NP region;
a plurality of first write access transistors formed in the first NP region or in the first PP region; and
a plurality of first read access transistors formed in the second NP region;
wherein a first write port is laid out in the first NP region of the first memory cell and a first read port laid out in the second NP region of the first memory cell, the first read port being separated from the first write port by a second write port of the second memory cell.

9. The apparatus of claim 8, wherein the second memory cell comprises:
a second storage unit comprising n-type transistors formed in the second NP region and p-type transistors formed in the first PP region;
a plurality of second write access transistors formed in the second NP region or in the first PP region; and
a plurality of second read access transistors formed in the second NP region.

10. The apparatus of claim 9, wherein one of the first read access transistors is connected to a corresponding one of the second read access transistors by one or more conductive features in one or more conductive layers formed over the first read access transistors and the second read access transistors.

11. The apparatus of claim 9, wherein one of the first write access transistors is connected to a corresponding one of the second write access transistors by one or more conductive features in one or more conductive layers formed over the first write access transistors and the second write access transistors.

12. The apparatus of claim 9, wherein the second memory cell further comprises a plurality of third read access transistors formed in the first NP region.

13. The apparatus of claim 8, wherein the first memory cell further comprises a plurality of fourth read access transistors formed in the first NP region.

14. An apparatus, comprising:
a first memory cell comprising:
a plurality of first write access transistors formed within a first area; and
a plurality of first read access transistors formed within a second area; and
a second memory cell comprising:
a plurality of second write access transistors formed within a third area between the first area and the second area,
wherein the first memory cell and the second memory cell are memory cells in adjacent rows of the same column.

15. The apparatus of claim 14, wherein the second memory cell further comprises a plurality of second read access transistors formed within the second area.

16. The apparatus of claim 15, wherein the second read access transistors and the second write transistors are formed in the same n-plus (NP) region overlapping the second area and the third area.

17. The apparatus of claim 15, wherein the second read access transistors are formed in an NP region within the second area, and the second write transistors are formed in a p-plus (PP) region adjacent to the NP region, the PP region overlapping the first area and the third area.

18. The apparatus of claim 14, wherein the first write access transistors are formed in an NP region and the first read access transistors are formed in another NP region.

19. The apparatus of claim 14, wherein the first memory cell further comprises third read access transistors formed within a fourth area, the first area being between the third area and the fourth area; and
the second memory cell further comprises fourth read access transistors formed within the fourth area.

20. The apparatus of claim 19, wherein the third read access transistors and the fourth read access transistors are formed in an NP region overlapping the first area and the fourth area.

* * * * *